United States Patent
Lee et al.

(10) Patent No.: US 12,218,140 B2
(45) Date of Patent: Feb. 4, 2025

(54) INTEGRATED CIRCUIT INCLUDING INTEGRATED STANDARD CELL STRUCTURE

(71) Applicant: SAMSUNG ELECTRONICS CO., LTD., Suwon-si (KR)

(72) Inventors: In Hak Lee, Hwaseong-si (KR); Sang Shin Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 456 days.

(21) Appl. No.: 17/735,607

(22) Filed: May 3, 2022

(65) Prior Publication Data
US 2023/0125996 A1    Apr. 27, 2023

(30) Foreign Application Priority Data
Oct. 26, 2021   (KR) .......................... 10-2021-0143276

(51) Int. Cl.
    *H01L 27/118*    (2006.01)
(52) U.S. Cl.
    CPC .................. *H01L 27/11807* (2013.01); *H01L 2027/11881* (2013.01)
(58) Field of Classification Search
    None
    See application file for complete search history.

(56) References Cited

U.S. PATENT DOCUMENTS

| | | |
|---|---|---|
| 6,445,215 B1 | 9/2002 | Takahashi et al. |
| 6,966,046 B2 | 11/2005 | Curran et al. |
| 7,030,643 B2 | 4/2006 | Kim |
| 8,266,561 B2 | 9/2012 | Penzes |
| 8,723,268 B2 | 5/2014 | Moroz et al. |
| 8,941,180 B2 * | 1/2015 | Anderson ........... H01L 27/1203 257/E29.273 |
| 8,964,497 B2 | 2/2015 | Yu |
| 9,166,600 B2 | 10/2015 | Kurokawa |
| 2008/0186059 A1 | 8/2008 | Nozoe |

FOREIGN PATENT DOCUMENTS

KR    1020000052102 A    8/2000

* cited by examiner

*Primary Examiner* — William C Trapanese
(74) *Attorney, Agent, or Firm* — Sughrue Mion, PLLC

(57) ABSTRACT

Integrated circuits including an integrated standard cell structure are provided. In an embodiment, an integrated circuit includes a first transistor gated by a first input and connected to a first power supply rail and an output, a second transistor gated by a second input and connected to the first power supply rail and the output, a floating third transistor and a fourth transistor that are connected to the first power supply rail and a third power supply rail, a fifth transistor gated by the first input and connected to a second power supply rail, a sixth transistor gated by the second input and connected to the second power supply rail, a seventh transistor gated by the second input and connected to the fifth transistor and the output, and an eighth transistor gated by the first input and connected to the sixth transistor and the output.

20 Claims, 23 Drawing Sheets

1

1

3

301

4

INTEGRATED CIRCUIT INCLUDING INTEGRATED STANDARD CELL STRUCTURE

CROSS-REFERENCE TO RELATED APPLICATIONS

This application is based on and claims priority under 35 U.S.C. § 119 to Korean Patent Application No. 10-2021-0143276, filed on Oct. 26, 2021, in the Korean Intellectual Property Office, the disclosure of which is incorporated by reference herein in its entirety.

BACKGROUND

1. Field

The present disclosure relates to an integrated circuit including an integrated standard cell structure.

2. Description of Related Art

An integrated circuit may be designed on the basis of standard cells. Specifically, a layout of the integrated circuit may be generated, by placing the standard cells according to the data defining the integrated circuit and routing the placed standard cells. Such standard cells are predesigned and stored in a cell library.

As the semiconductor fabricating process is miniaturized, the size of the patterns in the standard cell may decrease, and the size of the standard cell may also decrease.

SUMMARY

Aspects of the present disclosure provide integrated circuits including standard cell structures with reduced output capacitance, when compared to related integrated circuits, by connecting power supply rails to a source terminal and a drain terminal of at least one floating transistor.

According to an aspect of the present disclosure, there is provided an integrated circuit including a first transistor, which is gated by a first input, and has one end connected to a first power supply rail and another end connected to an output. The integrated circuit further includes a second transistor, which is gated by a second input, and has one end connected to the first power supply rail and another end connected to the output. The integrated circuit further includes a floating third transistor that has one end connected to the first power supply rail and another end connected to a third power supply rail. The integrated circuit further includes a floating fourth transistor that has one end connected to the first power supply rail and another end connected to the third power supply rail. The integrated circuit further includes a fifth transistor, which is gated by the first input, and has one end connected to a second power supply rail. The integrated circuit further includes a sixth transistor, which is gated by the second input, and has one end connected to the second power supply rail. The integrated circuit further includes a seventh transistor, which is gated by the second input, and has one end connected in series with the fifth transistor and another end connected to the output. The integrated circuit further includes an eighth transistor, which is gated by the first input, and has one end connected in series with the sixth transistor and has another end connected to the output.

According to an aspect of the present disclosure, there is provided an integrated circuit including a first active region that extends in a first direction. The integrated circuit further includes a second active region that extends in the first direction and that is spaced apart from the first active region in a second direction intersecting the first direction. The integrated circuit further includes a first source/drain contact that extends in the second direction, on the first active region and the second active region. The integrated circuit further includes an output contact via that is electrically connected to the first source/drain contact, and is configured to generate an output voltage. The integrated circuit further includes a first gate structure that is spaced apart from the first source/drain contact in the first direction, that extends in the second direction, and that is placed on the first active region and the second active region. The integrated circuit further includes a second gate structure that is spaced apart from the first source/drain contact in the first direction, that extends in the second direction, and that is placed on the first active region and the second active region. The integrated circuit further includes a second source/drain contact and a third source/drain contact that are spaced apart from the first gate structure in the first direction, that extend in the second direction, and that are spaced apart from each other in the second direction. The integrated circuit further includes a fourth source/drain contact and a fifth source/drain contact that are spaced apart from the second gate structure in the first direction, that extend in the second direction, and that are spaced apart from each other in the second direction. The integrated circuit further includes a third gate structure and a fourth gate structure that are spaced apart from the second source/drain contact and the third source/drain contact in the first direction, that extend in the second direction, and that are spaced apart from each other in the second direction. The integrated circuit further includes a fifth gate structure and a sixth gate structure that are spaced apart from the fourth source/drain contact and the fifth source/drain contact in the first direction, that extend in the second direction, and that are spaced apart from each other in the second direction. The integrated circuit further includes a sixth source/drain contact and a seventh source/drain contact that are spaced apart from the third gate structure and the fourth gate structure in the first direction, that extend in the second direction, and that are spaced apart from each other in the second direction. The integrated circuit further includes an eighth source/drain contact and a ninth source/drain contact that are spaced apart from the fifth gate structure and the sixth gate structure in the first direction, that extend in the second direction, and that are spaced apart from each other in the second direction. The fourth gate structure is electrically connected to a first input contact via and configured to receive a first input through the first input contact via. The second gate structure is electrically connected to a second input contact via and configured to receive the first input through the second input contact via. The first gate structure is electrically connected to a third input contact via and configured to receive a second input through the third input contact via. The sixth gate structure is electrically connected to a fourth input contact via and configured to receive the second input through the fourth input contact via. The second source/drain contact and the fourth source/drain contact are electrically connected to a first power supply rail. The seventh source/drain contact and the ninth source/drain contact are electrically connected to a second power supply rail. The sixth source/drain contact and the eighth source/drain contact are electrically connected to a third power supply rail.

According to an aspect of the present disclosure, there is provided an integrated circuit including a logic circuit configured to receive a first input and a second input, and to perform a logical operation to generate an output. The logic circuit includes a first transistor, which is gated by the first input, and has one end connected to a first power supply rail and another end connected to the output. The logic circuit further includes a second transistor, which is gated by the second input, and has one end connected to the first power supply rail and another end connected to the output. The logic circuit further includes a floating third transistor that has one end connected to the first power supply rail and another end connected to a third power supply rail. The logic circuit further includes a floating fourth transistor that has one end connected to the first power supply rail and another end connected to the third power supply rail. The logic circuit further includes a fifth transistor, which is gated by the first input, and has one end connected to a second power supply rail. The logic circuit further includes a sixth transistor, which is gated by the second input, and has one end connected to the second power supply rail. The logic circuit further includes a seventh transistor, which is gated by the second input, and has one end connected in series with the fifth transistor and another end connected to the output. The logic circuit further includes an eighth transistor, which is gated by the first input, and has one end connected in series with the sixth transistor and another end connected to the output.

According to an aspect of the present disclosure, there is provided an integrated circuit including a first transistor, which is gated by a first input, and has a first end connected to a first power supply rail and another end connected to an output. The integrated circuit further includes a second transistor, which is gated by a second input, and has a second end connected to the first power supply rail and another end connected to the output. The integrated circuit further includes a third transistor, which is gated by a separate power gating voltage, and has one end connected to the first end of the first transistor and another end connected to a third power supply rail. The integrated circuit further includes a fourth transistor, which is gated by the separate power gating voltage, and has one end connected to the second end of the second transistor and another end connected to the third power supply rail. The integrated circuit further includes a fifth transistor, which is gated by the first input, and has one end connected to a second power supply rail. The integrated circuit further includes a sixth transistor, which is gated by the second input, and has one end connected to the second power supply rail. The integrated circuit further includes a seventh transistor, which is gated by the second input, and has one end connected in series with the fifth transistor and another end connected to the output. The integrated circuit further includes an eighth transistor, which is gated by the first input, and has one end connected in series with the sixth transistor and another end connected to the output.

BRIEF DESCRIPTION OF THE DRAWINGS

The above and other aspects and features of the present disclosure may become more apparent by describing in detail exemplary embodiments thereof with reference to the attached drawings, in which.

DETAILED DESCRIPTION

The embodiments described herein are example embodiments, and thus, the disclosure is not limited thereto and may be realized in various other forms. As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
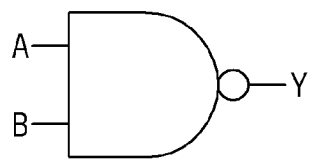
FIG. 1 is a diagram showing a NAND logic circuit.

FIG. 1 is a diagram showing a NAND logic circuit.

Referring to FIG. 1, a NAND logic circuit 1 may receive a first input A and a second input B to perform a NAND logical operation. The NAND logic circuit 1 may perform the NAND logical operation on the basis of the first input A and the second input B to generate an output Y.

The output Y generated by the NAND logic circuit 1 has "0" when both the first input A and the second input B are "1", and the output Y has "1" in the remaining cases.

Figure 2:
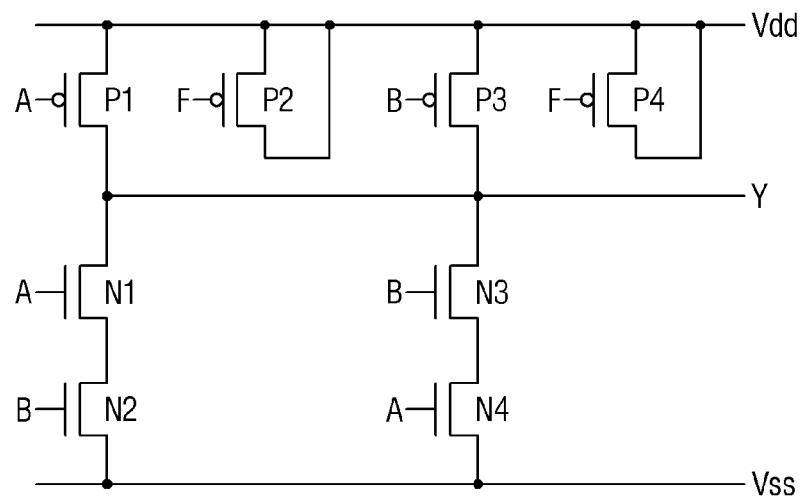
FIG. 2 is an exemplary circuit diagram showing the NAND logic circuit according to some embodiments.

The NAND logic circuit 1 is described in reference to a circuit diagram illustrated in FIG. 2.

FIG. 2 is an exemplary circuit diagram showing the NAND logic circuit 1 according to some embodiments.

Referring to FIG. 2, the NAND logic circuit 1 according to some embodiments has transistors N1, N4 and P1 gated by the first input A, transistors N2, N3 and P3 gated by the second input B, and floating transistors P2 and P4.

The transistors P1, P2, P3 and P4 are P-channel metal-oxide-semiconductor (PMOS) transistors. Further, the transistors N1, N2, N3 and N4 are N-channel metal-oxide-semiconductor (NMOS) transistors.

Sources of the transistors P1 and P3 are connected to a power supply voltage Vdd, and drains of the transistors P1 and P3 are connected to the output Y.

The transistors N1 and N2 are connected in series with each other. More specifically, the drain of the transistor N1 is connected to the output Y, the gate receives the first input A, and the source is connected to the drain of the transistor N2. Further, the source of the transistor N2 is connected to a ground voltage Vss, the gate receives the second input B, and the drain is connected to the source of the transistor N1.

The transistors N3 and N4 are connected in series with each other. More specifically, the drain of the transistor N3 is connected to the output Y, the gate receives the second input B, and the source is connected to the drain of the transistor N4. Further, the source of the transistor N4 is connected to the ground voltage Vss, the gate receives the first input A, and the drain is connected to the source of the transistor N3.

In some embodiments, both the sources and drains of the transistors P2 and P4 may be connected to the power supply voltage Vdd.

Therefore, since both the sources and drains of the floating transistors P2 and P4 are connected to the power supply voltage Vdd, the stability of the floating transistors P2 and P4 is improved. More specifically, both the sources and drains of the floating transistors P2 and P4 may be connected to the power supply voltage Vdd to reduce the output capacitance as seen from the output terminal Y. Alternatively or additionally, the sources of the floating transistors P2 and P4 may be connected to one power supply rail (e.g., the power supply voltage Vdd), and the drains of the floating transistors P2 and P4 may be connected to another power supply rail (e.g., the ground voltage Vss, an external power supply voltage Vdd_ext).

Figure 3:
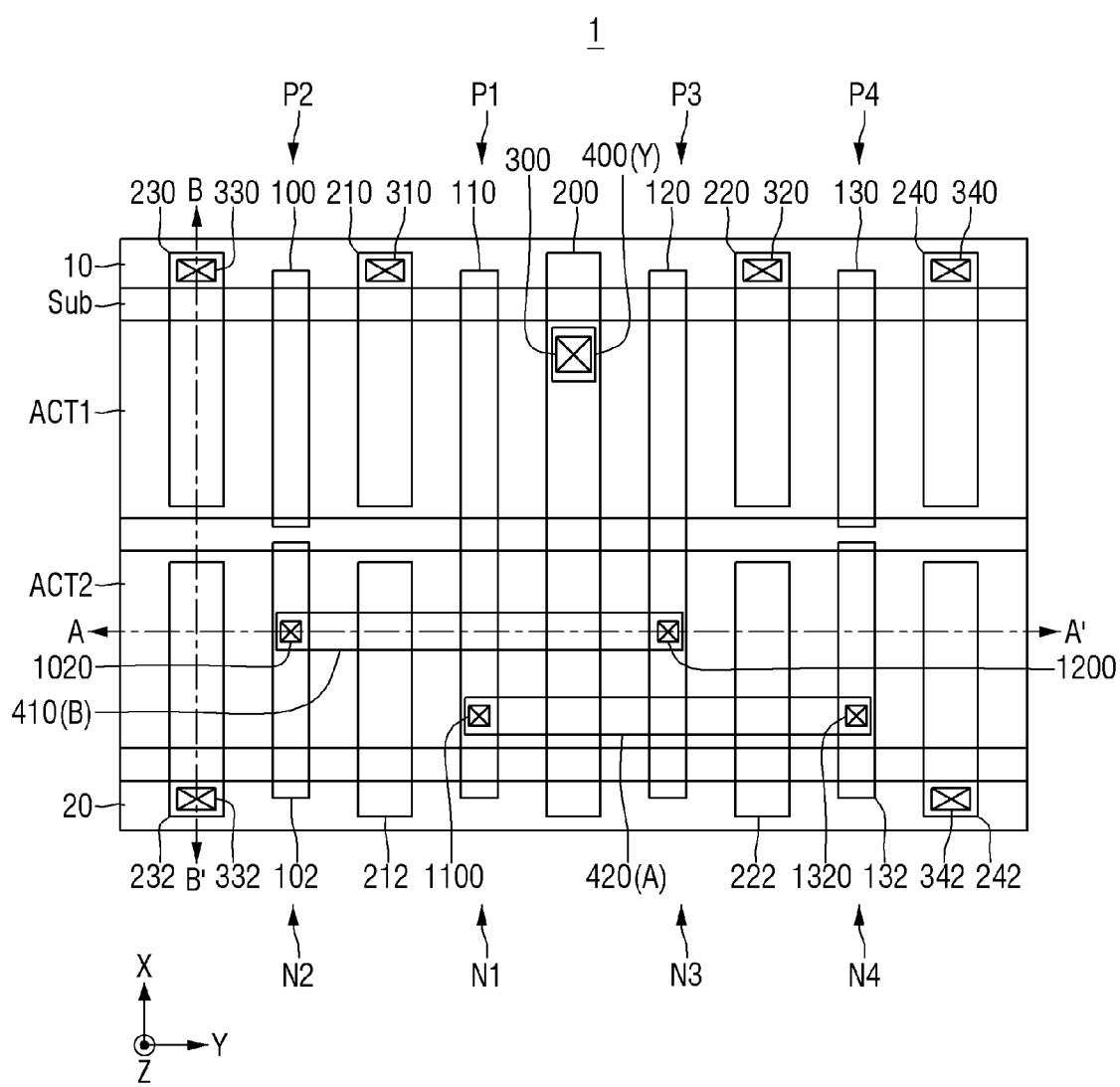
FIG. 3 is an exemplary layout diagram showing the NAND logic circuit according to some embodiments.

A structure in which both the sources and drains of the floating transistors P2 and P4 are connected to the power supply voltage Vdd is described in reference to a layout diagram illustrated in FIG. 3.

FIG. 3 is an exemplary layout diagram showing the NAND logic circuit 1 according to some embodiments.

Referring to FIG. 3, the PMOS transistors P1, P2, P3, and P4 may be formed on the first active region ACT1 extending in a first direction y. Further, the NMOS transistors N1, N2, N3, and N4 may be formed on the second active region ACT2 extending in the first direction y and placed apart from the first active region ACT1 in the second direction x.

For reference, although not shown, a first active pin protruding from the first active region ACT1 in a third direction z may be formed on the first active region ACT1. Further, a second active pin protruding from the second active region ACT2 in the third direction z may be formed on the second active region ACT2. The first active pin and the second active pin may be formed to be spaced apart from each other in the second direction x. Further, the first active pin and the second active pin may each extend in the first direction y.

The first active region ACT1 may be a region in which a p-type transistor is formed. The first active region ACT1 may include, for example, a well region doped with n-type impurities. The second active region ACT2 may be a region in which an n-type transistor is formed. The second active region ACT2 may include, for example, a well region doped with p-type impurities. The first active region ACT1 and the second active region ACT2 may be placed apart from each other along the second direction x.

A first power supply rail 10 may be placed in an upper part in the second direction x from the first active region ACT1. Further, a second power supply rail 20 may be placed in a lower part in the second direction x from the second active region ACT2. The first power supply rail 10 may be, for example, a power supply rail to which the power supply voltage Vdd is supplied. Further, the second power supply rail 20 may be, for example, a ground rail to which the ground voltage Vss is supplied.

The NAND logic circuit 1 according to some embodiments may include a plurality of gate structures (e.g., 100, 102, 110, 120, 130 and 132), and source/drain contacts (e.g., 200, 210, 212, 220, 222, 230, 232, 240 and 242) which extend in the second direction x and are spaced apart from each other in the first direction y.

For example, the source/drain contacts 210, 220, 230 and 240 extending in the other second direction x may be placed apart from each other in the first direction y, centering on the first source/drain contact 200 extending in the second direction x on the first active region ACT1.

Further, for example, a plurality of gate structures 100, 110, 120 and 130 may extend in the second direction x, and be placed apart from each other in the first direction y.

The source/drain contacts 210, 220, 230 and 240 are each electrically connected to the first power supply rail 10 through the contact vias 310, 320, 330 and 340, and may receive supply of the power supply voltage Vdd.

That is, the first gate structure 100 and the source/drain contacts 210 and 230 may form a floating transistor P2 of FIG. 2. Further, the second gate structure 110 and the source/drain contacts 210 and 200 may form a transistor P1 of FIG. 2. Further, the third gate structure 120 and the source/drain contacts 200 and 220 may form a transistor P3 of FIG. 2. Further, the fourth gate structure 130 and the source/drain contacts 220 and 240 may form a floating transistor P4 of FIG. 2.

That is, both the sources and drains of the transistors P2 and P4 may be connected to the power supply voltage Vdd.

Therefore, since both the sources and drains of the floating transistors P2 and P4 are connected to the power supply voltage Vdd, the stability of the floating transistors P2 and P4 is improved. More specifically, both the sources and drains of the floating transistors P2 and P4 may be connected to the power supply voltage Vdd to reduce the output capacitance as seen from the output terminal Y.

For example, the source/drain contacts 212, 222, 232 and 242 extending in the other second direction x may be placed apart from each other in the first direction y, centering on the first source/drain contact 200 extending in the second direction x on the second active region ACT2.

Further, for example, a plurality of gate structures 102, 110, 120 and 132 may extend in the second direction x and be placed apart from each other in the first direction y.

The source/drain contacts 232 and 242 are each electrically connected to the second power supply rail 20 through the contact vias 332 and 342, and may receive supply of the ground voltage Vss.

That is, a fifth gate structure 102 and source/drain contacts 212 and 232 may form the transistor N2 of FIG. 2. Further, the second gate structure 110 and the source/drain contacts 212 and 200 may form the transistor N1 of FIG. 2. Further, the third gate structure 120 and the source/drain contacts 200 and 222 may form the transistor N3 of FIG. 2. Further, a sixth gate structure 132 and the source/drain contacts 222 and 242 may form the transistor N4 of FIG. 2.

The third gate structure 120 and the fifth gate structure 102 are each electrically connected to a first input contact via 1200 and a second input contact via 1020, and may receive the second input B. More specifically, the first input contact via 1200 and the second input contact via 1020 are electrically connected to a metal line 410 that receives the second input B, the first input contact via 1200 transfers the second input B to the third gate structure 120, and the second input contact via 1020 may transfer the second input B to the fifth gate structure 102.

The second gate structure 110 and the sixth gate structure 132 are each electrically connected to the third input contact via 1100 and the fourth input contact via 1320, and may receive the first input A. More specifically, the third input contact via 1100 and the fourth input contact via 1320 are electrically connected to a metal line 420 that receives the first input A, the third input contact via 1100 transfers the first input A to the second gate structure 110, and the fourth input contact via 1320 may transfer the first input A to the sixth gate structure 132.

The NAND logic circuit 1 according to some embodiments may output the output Y of the NAND logical operation performed on the first input A and the second input B to the outside through the source/drain contact 200. More specifically, the source/drain contact 200 is electrically connected to the output contact via 300, and may transfer the output Y to the outside through the metal line 400 electrically connected to the output contact via 300.

A structure for each layer and cross-sectional structures along the third direction z of the NAND logic circuit 1 according to some embodiments is described in reference to FIGS. 4 to 11.

Figure 4:
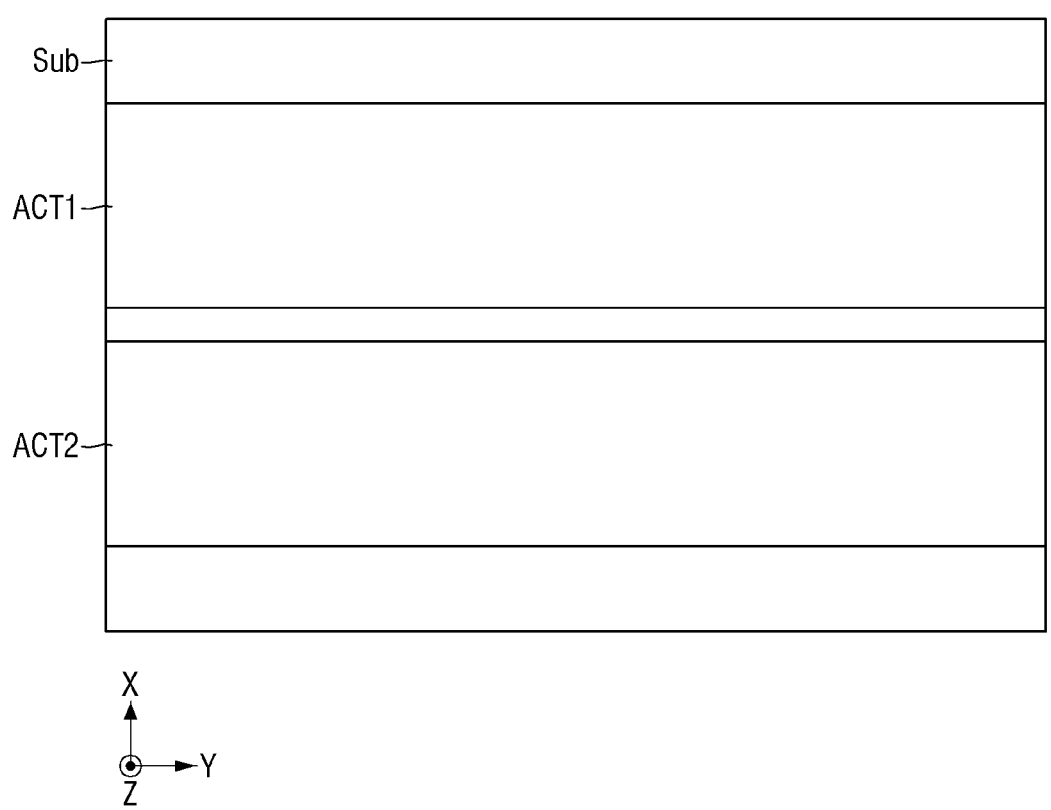
FIG. 4 is a layout diagram showing an Front-End-Of-Line (FEOL) of FIG. 3 as an example.

FIG. 4 is a layout diagram showing an Front-End-Of-Line (FEOL) of FIG. 3 as an example.

Referring to FIG. 4, the first active region ACT1 and the second active region ACT2 extending in the first direction y are placed apart from each other in the second direction x.

The first active region ACT1 may be a region in which a p-type transistor is formed. The first active region ACT1 may include, for example, a well region doped with n-type impurities. The second active region ACT2 may be a region in which an n-type transistor is formed. The second active region ACT2 may include, for example, a well region doped with p-type impurities.

Although not shown, a first active pin protruding from the first active region ACT1 in the third direction z may be formed on the first active region ACT1. Further, a second active pin protruding from the second active region ACT2 in the third direction z may be formed on the second active region ACT2. The first active pin and the second active pin may be formed spaced apart from each other in the second direction x. Further, the first active pin and the second active pin may each extend in the first direction y.

Figure 5:
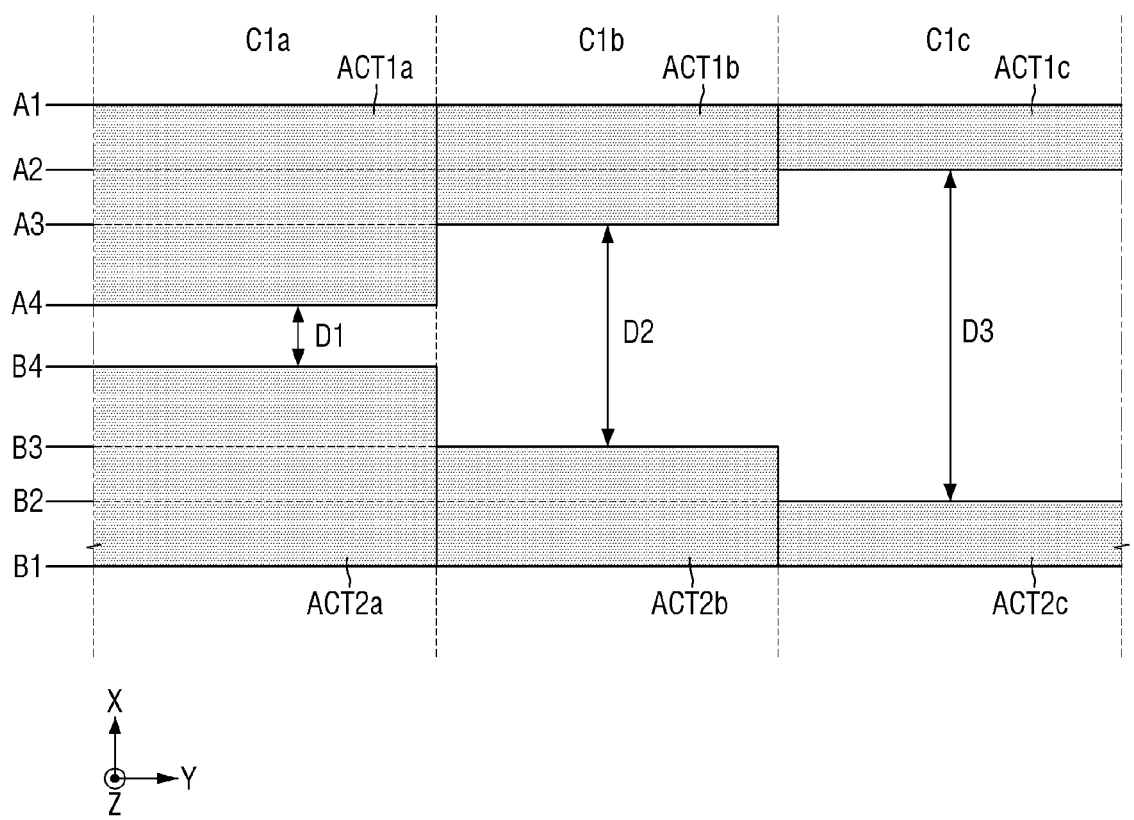
FIG. 5 is a layout diagram showing FIG. 4 as an example.

FIG. 5 is a layout diagram showing FIG. 4 as an example.

Referring to FIG. 5, the thicknesses in the second directions x of each active region in a plurality of cells (e.g., a $1a^{th}$ cell C1a to a $1c^{th}$ cell C1c) may be different from each other.

For example, the $1a^{th}$ active region ACT1a of the $1a^{th}$ cell C1a may be formed from an A1 boundary of the $1a^{th}$ cell C1a to an A4 boundary spaced apart from a $2a^{th}$ active region ACT2a. Similarly, the $2a^{th}$ active region ACT2a of the $1a^{th}$ cell C1a may be formed from a B1 boundary of the $1a^{th}$ cell C1a to a B4 boundary spaced apart from the $1a^{th}$ active region ACT1a. That is, the $1a^{th}$ active region ACT1a and the $2a^{th}$ active region ACT2a may be placed apart from each other by a first length D1 in the second direction y.

A $1b^{th}$ active region ACT1b of a $1b^{th}$ cell C1b adjacent to the $1a^{th}$ cell C1a may be formed from the A1 boundary of the $1b^{th}$ cell C1b to an A3 boundary spaced apart from a $2b^{th}$ active region ACT2b. Similarly, the $2b^{th}$ active region ACT2b of the $1b^{th}$ cell C1b may be formed from the B1 boundary of the $1b^{th}$ cell C1b to a B3 boundary spaced apart from the $1b^{th}$ active region ACT1b. That is, the $1b^{th}$ active region ACT1b and the $2b^{th}$ active region ACT2b may be placed apart from each other by a second length D2 in the second direction y.

A $1c^{th}$ active region ACT1c of a $1c^{th}$ cell C1c adjacent to the $1b^{th}$ cell C1b may be formed from the A1 boundary of the $1c^{th}$ cell C1c to an A2 boundary spaced apart from a $2c^{th}$ active region ACT2c. Similarly, the $2c^{th}$ active region ACT2c of the $1c^{th}$ cell C1c may be formed from the B1 boundary of the $1c^{th}$ cell C1c to a B2 boundary spaced apart from the $1c^{th}$ active region ACT1c. That is, the $1c^{th}$ active region ACT1c and the $2c^{th}$ active region ACT2c may be placed to be spaced apart from each other by a third length D3 in the second direction y.

The form and arrangement of the active region placed in consecutive cells is not limited to this drawing.

Figure 6:
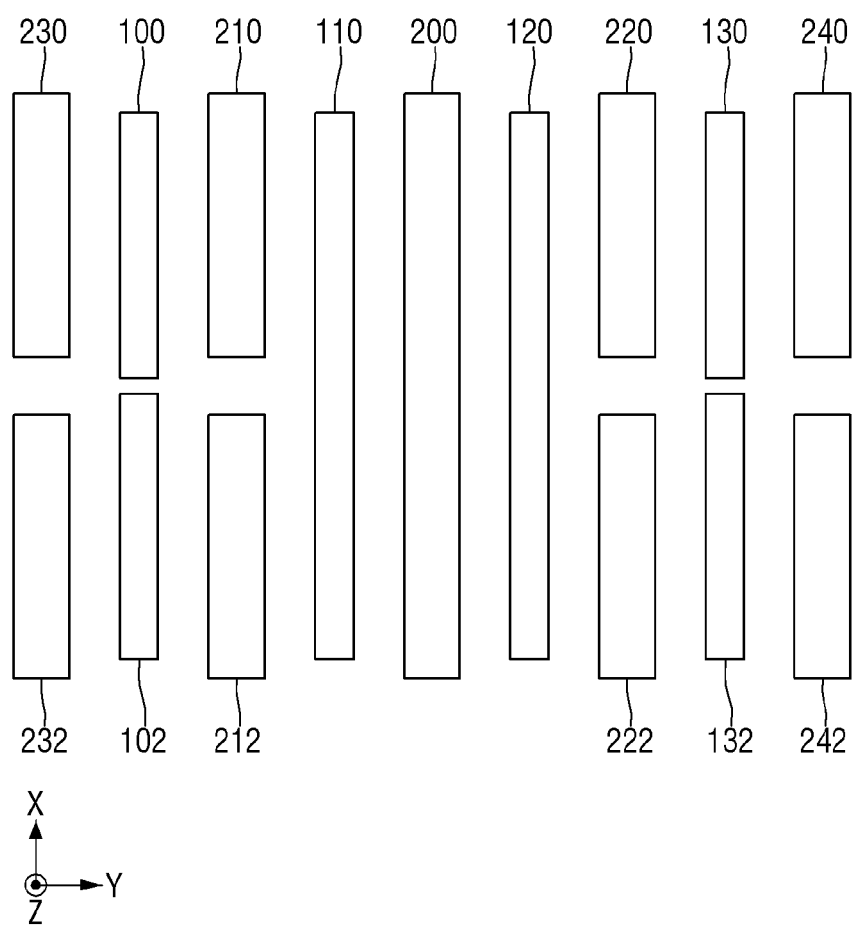
FIG. 6 is a layout diagram showing a middle-of-line (MOL) of FIG. 3 as an example.

FIG. 6 is a layout diagram showing a middle-of-line (MOL) of FIG. 3 as an example.

Referring to FIG. 6, the plurality of source/drain contacts 200, 210, 212, 220, 222, 230, 232, 240, and 242 and the plurality of gate structures 100, 102, 110, 120, 130 and 132 may be placed apart from each other in the first direction y. The plurality of source/drain contacts 200, 210, 212, 220, 222, 230, 232, 240, and 242 and the plurality of gate structures 100, 102, 110, 120, 130 and 132 may each extend in the second direction x.

The plurality of gate structures 100, 102, 110, 120, 130 and 132 and the plurality of source/drain contacts 200, 210, 212, 220, 222, 230, 232, 240 and 242 placed adjacent to each other in the first direction y may be spaced apart from each other by 1 contacted poly pitch (CPP). As an example, the first gate structure 100 and the first source/drain contact 200 adjacent to each other may be spaced apart by 1 CPP.

For example, assuming that the first gate structure 100 and the source/drain contact 210 are adjacent to each other, if a distance between a center line of the first gate structure 100 extending in the second direction x and a center line of the source/drain contact 210 extending in the second direction x is 1 CPP, then no other gate structure or source/drain contact may be placed between the first gate structure 100 and the source/drain contact 210.

Figure 7:
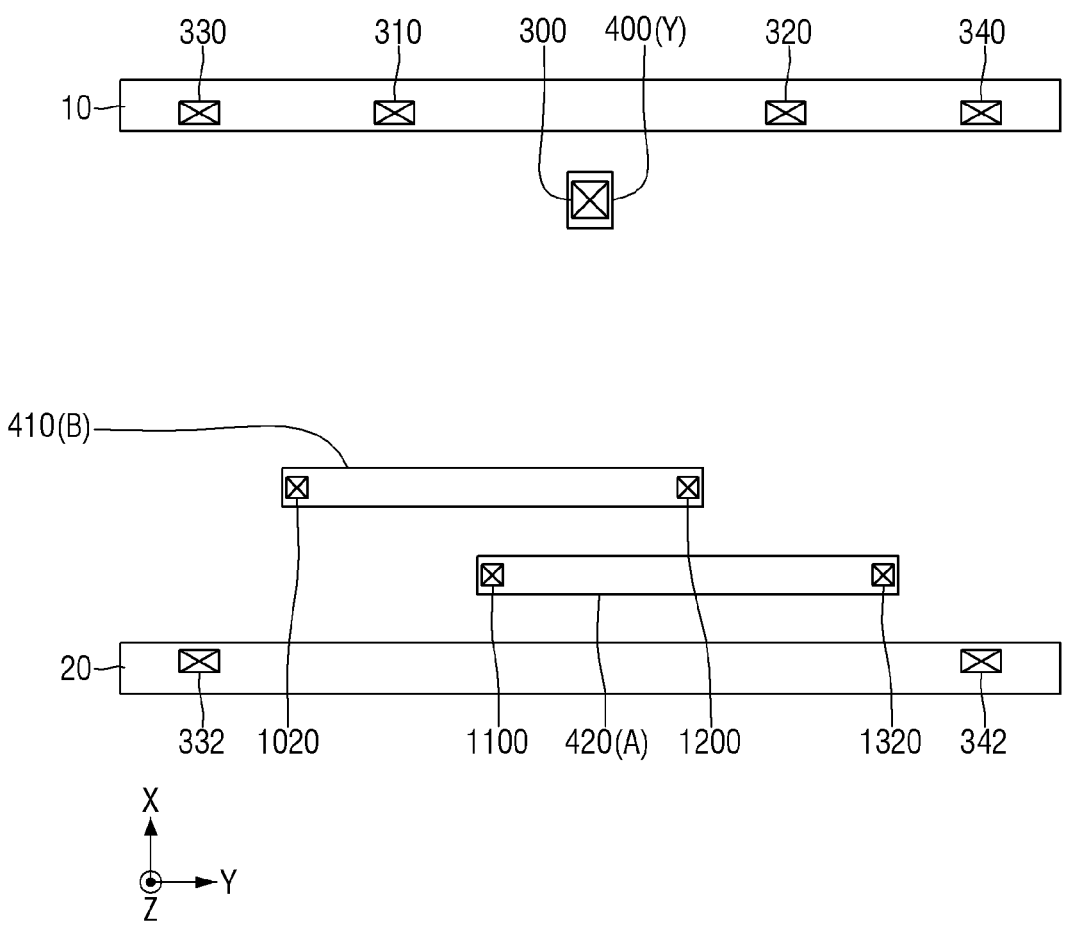
FIG. 7 is a layout diagram showing a Back-End-Of-Line (BEOL) of FIG. 3 as an example.

FIG. 7 is a layout diagram showing a Back-End-Of-Line (BEOL) of FIG. 3 as an example.

Referring to FIG. 7, a plurality of metal lines 400, 410 and 420, a first power supply rail 10, and a second grounding rail 20 may be placed apart from each other in the second direction x. The plurality of metal lines 400, 410 and 420, the first power supply rail 10, and the second grounding rail 20 may each extend in the first direction y.

Contact vias 310, 320, 330 and 340 that transfer the power supply voltage Vdd to each of the source/drain contacts 210, 220, 230 and 240 may be placed on the first power supply rail 10. Further, contact vias 332 and 342 for grounding the source/drain contacts 232 and 242 may be placed on the second power supply rail 20.

The metal line 410 may be electrically connected to a plurality of input contact vias 1020 and 1200 for gating the gate structures 102 and 120 to the second input B. The plurality of input contact vias 1020 and 1200 may extend in the third direction z.

The metal line 420 may be electrically connected to a plurality of input contact vias 1100 and 2220 for gating the gate structures 110 and 132 to the first input A. The plurality of input contact vias 1100 and 2220 may extend in the third direction z.

The metal lines 400, 410 and 420 placed adjacent to each other in the second direction x may be spaced apart in the unit of 1 CPP. In an example, the metal line 410 and the metal line 420 adjacent to each other may be spaced apart by 1 CPP.

For example, assuming that metal line 410 and metal line 420 are adjacent to each other, if a distance between the center line of the metal line 410 extending in the first direction y and the center line of the metal line 420 extending in the first direction y is 1 CPP, then no other metal line may be placed between the metal line 410 and the metal line 420.

Figure 8:
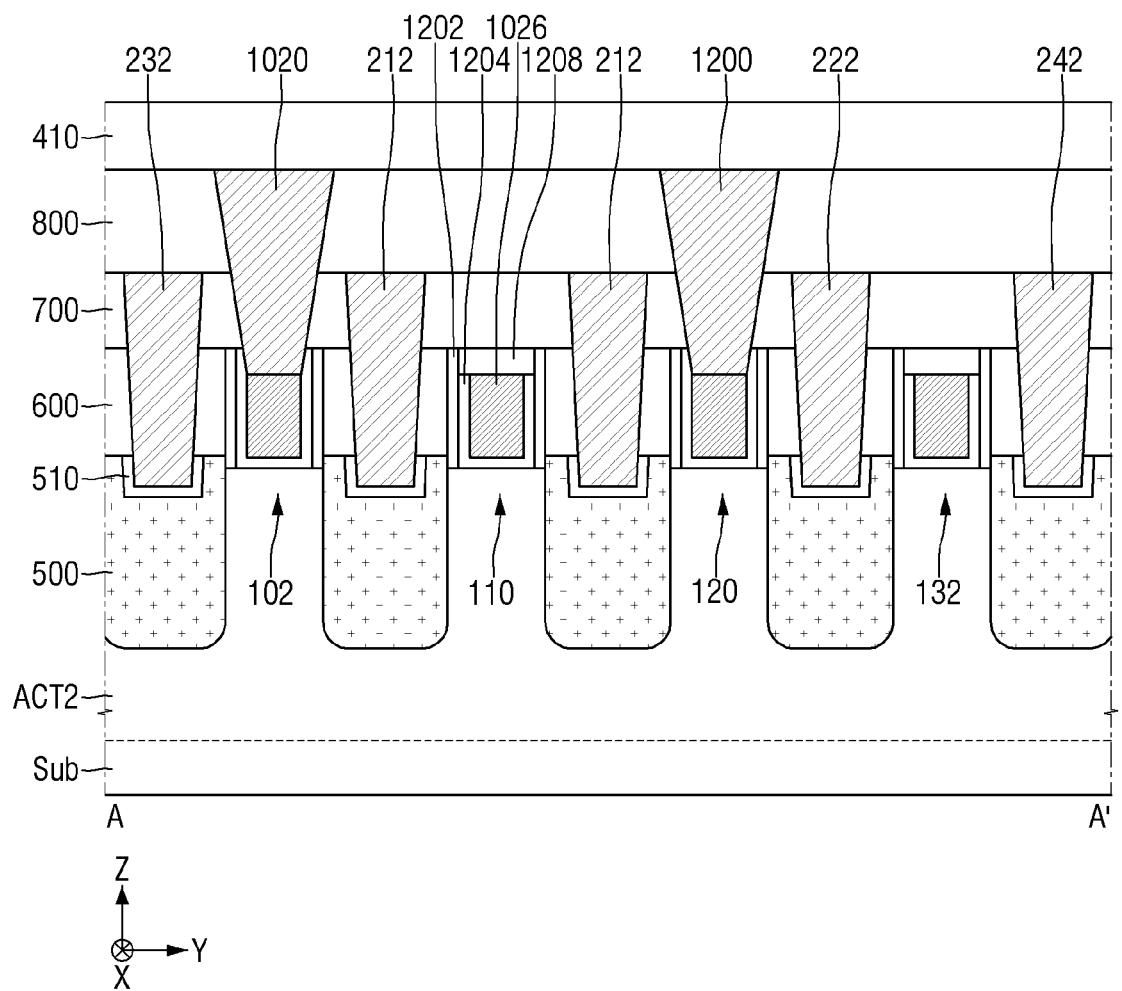
FIGS. 8 and 9 are cut planes taken along A-A' of FIG. 3.
Figure 9:
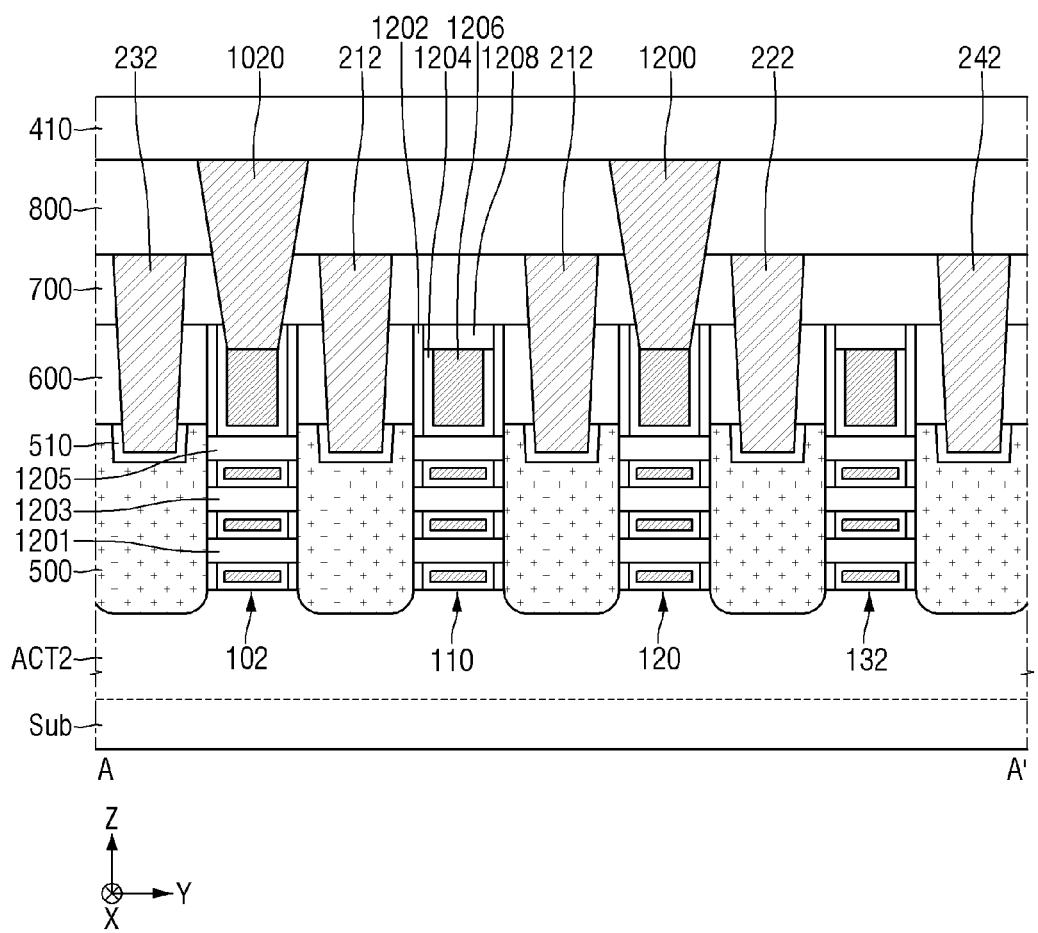

FIGS. 8 and 9 are cut planes taken along A-A' of FIG. 3.

It may be understood that the description of FIGS. 8 and 9 is also applicable to other cross sections.

Referring to FIG. 8, a semiconductor integrated circuit including the NAND integrated circuit according to some embodiments may have a fin-type transistor (FinFET) structure including a channel region of a fin-type pattern shape.

The fin-type transistor according to some embodiments may be formed on a substrate Sub and the active region (e.g., the second active region ACT2) on the substrate Sub.

The substrate Sub may be a silicon substrate or a silicon on insulator (SOI). In contrast, the substrate Sub may include, but is not limited to, silicon germanium, silicon germanium on insulator (SGOI), indium antimonide, lead tellurium compounds, indium arsenic, indium phosphide, gallium arsenide, or gallium antimonide.

The second active region ACT2 may be defined along the first direction y. The second active region ACT2 may be defined by a deep trench. The second active region ACT2 may be a region in which an n-type transistor is formed. The second active region ACT2 may include, for example, a well region doped with p-type impurities. The second active region ACT2 may protrude from the substrate Sub (not shown). The second active region ACT2 may include an epitaxial layer (not shown) that is grown from the substrate Sub.

The fin-type transistor according to some embodiments includes a plurality of gate structures 102, 110, 120 and 132, a source/drain region 500, a silicide layer 510, a first interlayer insulating film 600, and a second interlayer insulating film 700.

Each of the plurality of gate structures 102, 110, 120 and 132 may include a gate spacer 1202, a gate insulating film 1204, a gate electrode 1206, and a capping pattern 1208.

The structures of each of the plurality of gate structures are not limited to this drawing.

The plurality of gate structures 102, 110, 120 and 132 and the source/drain region 500 may extend in the second direction x on the second active region ACT2.

The gate spacer 1202 may extend in the third direction z along both side walls of the gate insulating film 1204. The gate insulating film 1204 may be placed between the gate electrode 1206 and the gate spacer 1202 and below the capping pattern 1208. The capping pattern 1208 may be placed on each of the gate electrode 1206 and the gate insulating film 1204. The gate spacer 1202, the gate insulating film 1204, and the capping pattern 1208 may include an insulating material.

The source/drain region 500 may be formed by removing a part of the second active region ACT2 to form a recess and then filling the recess through an epitaxial process. The source/drain region 500 may be formed on the second active region ACT2. The source/drain region 500 may be doped with impurities of a conductive type different from that of the semiconductor pattern formed on the second active region ACT2.

A plurality of input contact vias 1020 and 1200, and a metal line 410 are further included to apply an electrical signal to the fin-type transistor according to some embodiments.

The plurality of input contact vias 1020 and 1200 may be surrounded by a third interlayer insulating film 800.

The silicide layer 510 may be placed between the source/drain region 500 and each of the plurality of source/drain contacts 212, 222, 232 and 242.

Each of the plurality of source/drain contacts 212, 222, 232 and 242 may be electrically connected to the source/drain region 500 through the silicide layer 510. Each of the plurality of source/drain contacts 212, 222, 232 and 242 are formed in the third direction z and may extend in the second direction x.

The plurality of input contact vias 1020 and 1200 may be electrically connected to the plurality of gate structures 102 and 120. Each of the plurality of gate structures 102 and 120 may be electrically connected to the plurality of input contact vias 1020 and 1200. The plurality of input contact vias 1020 and 1200 may be electrically connected to the metal lines 410.

The first interlayer insulating film 600 may surround the plurality of gate structures 102, 110, 120 and 132 and the plurality of source/drain contacts 212, 222, 232 and 242.

The second interlayer insulating film 700 may be formed on the first interlayer insulating film 600. The second interlayer insulating film 700 may surround the plurality of source/drain contacts 212, 222, 232 and 242.

The third interlayer insulating film 800 may be formed on the second interlayer insulating film 700. The third interlayer insulating film 800 may surround a plurality of input contact vias 1020 and 1200.

The first interlayer insulating film 400 to the third interlayer insulating film 800 may include an insulating material.

Referring to FIG. 9, a semiconductor integrated circuit including the NAND integrated circuit according to some embodiments may have a transistor (e.g., Multi-Bridge Channel Field Effect Transistor (MBCFET™)) structure including a plurality of nanowires. Repeated description of contents of FIG. 8 is not provided, and the differences are mainly described.

A first nanowire 1201 to a third nanowire 1205 (e.g., nanowires 1201, 1203, and 1205) may be placed on the substrate Sub or the second active region ACT2 to be sequentially spaced apart in the third direction z. The first nanowire 1201 to the third nanowire 1205 may extend in the second direction x.

The gate electrode 1206, the gate insulating film 1204 surrounding the gate insulating film 1204, and the gate spacer 1202 formed on the side walls of the gate insulating film 1204 may surround each of the first nanowire 1201 to the third nanowire 1205.

Referring to FIG. 9, although the gate spacer 1202 is shown as being formed of a single film, the present disclosure is not limited thereto. That is, in some other embodiments, the gate spacer 1202 may be formed of a multi-film.

The gate insulating film 1204 may be placed between the gate electrode and the gate spacer 1202, between the gate electrode 1206 and the third nanowire 1205, between the gate electrode 1206 and the second nanowire 1203, between the gate electrode 1206 and the first nanowire 1201, and between the gate electrode 1206 and the second active region ACT2.

The source/drain region 500 may be placed on at least one side of the first nanowire 1201 to the third nanowire 1205. Further, the source/drain region 500 may be in contact with each of the first to third nanowires.

The structure of the NAND logic circuit 1 according to some embodiments is not limited thereto. For example, the structure of the NAND logic circuit 1 according to some embodiments may be a planar transistor structure.

Figure 10:
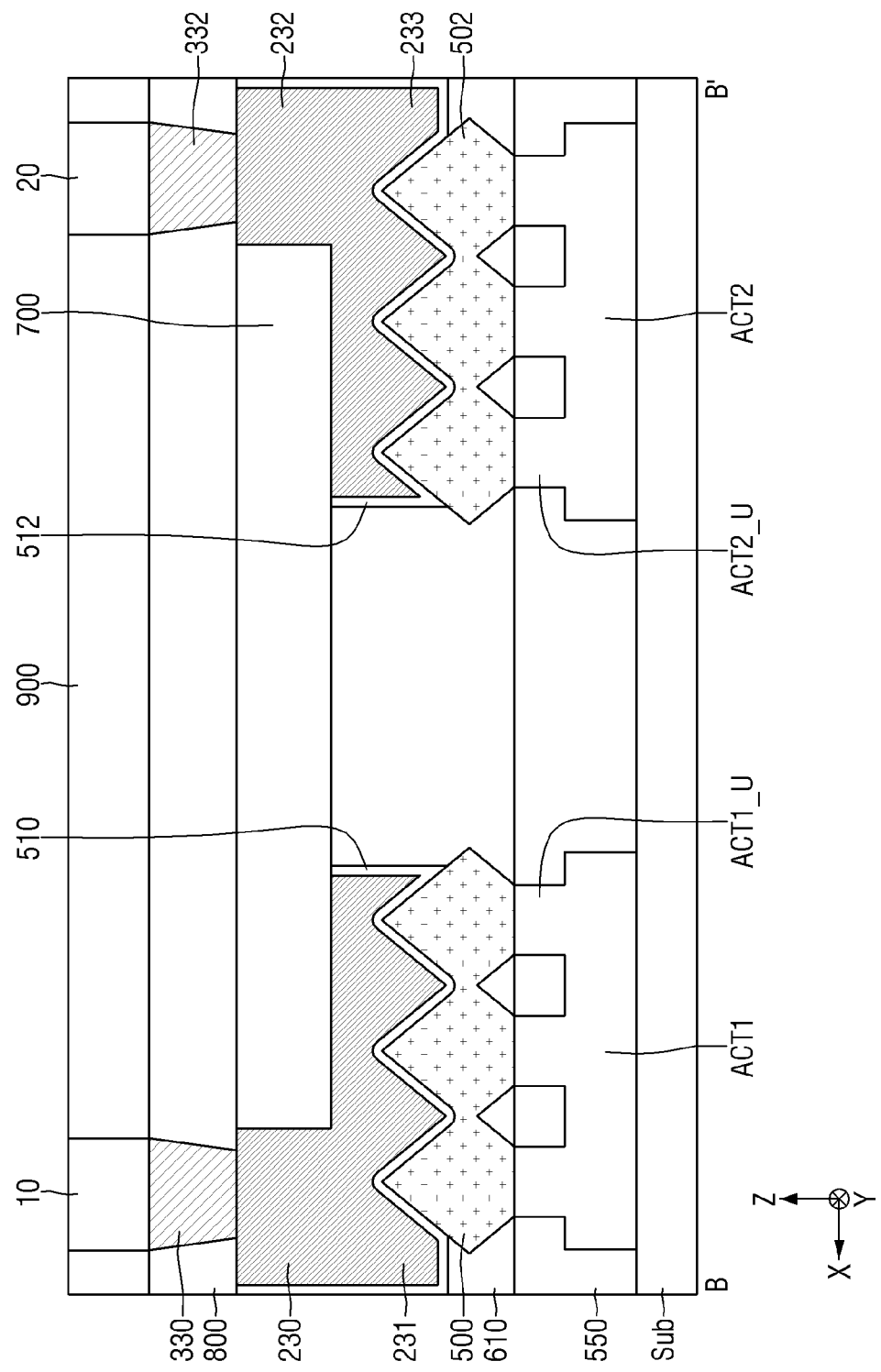
FIGS. 10 and 11 are cut surfaces taken along B-B' of FIG. 3.
Figure 11:
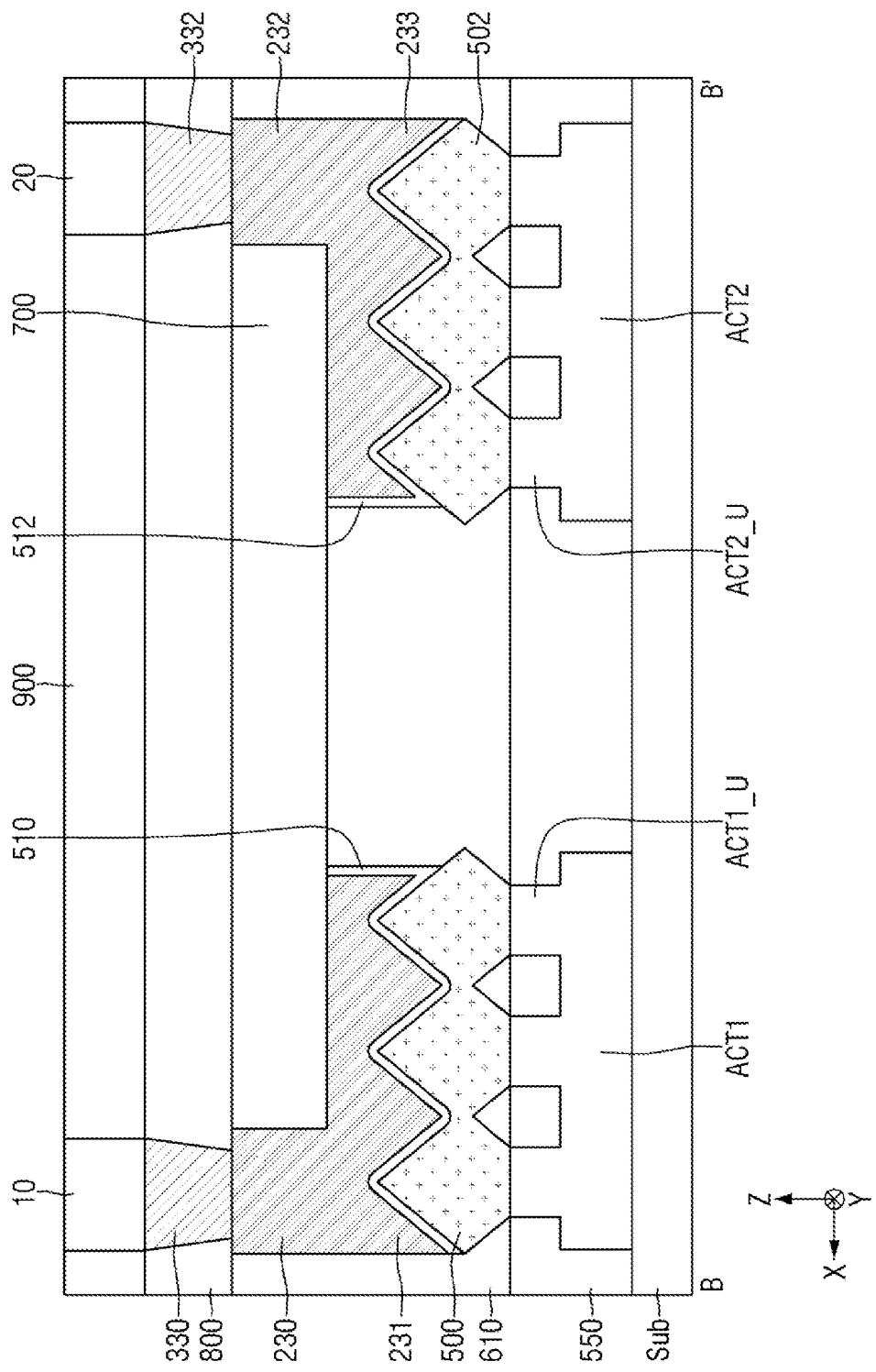

FIGS. 10 and 11 are cut surfaces as seen by taken along B-B' of FIG. 3.

Referring to FIG. 10, each of a plurality of source/drain regions 500 and 502 may be formed on the first active region ACT1 and the second active region ACT2 on the substrate Sub. Repeated description of the above contents is not provided.

At least a part of the plurality of source/drain regions 500 and 502 may be included in the source/drain regions of the plurality of transistors. The source/drain region 500 formed on the first active region ACT1 and the source/drain region 502 formed on the second active region ACT2 may be doped with impurities of different conductive type from each other.

A cell separation film 550 may be formed on the substrate Sub. The cell separation film 550 may fill a deep trench that distinguishes the first active region ACT1 and the second active region ACT2. The cell separation film 550 may extend in the first direction y. The cell separation film 550 may include an insulating material.

A source/drain contact cutting pattern 610 may be placed on the cell separation film 550. The source/drain contact cutting pattern 610 may extend in the first direction y. The source/drain contact cutting pattern 610 may include an insulating material.

The source/drain contact cutting pattern 610 may cut the source/drain contact at the boundary of the cells. The source/drain contact cutting pattern 610 may come into contact with the source/drain contacts 230, 231, 232, and 233.

A source/drain contact 230 is formed on a source/drain lower contact 231, and the source/drain contact 230 and the source/drain lower contact 231 may fill the trench defined by the silicide layer 510.

Similarly, the source/drain contact 232 is formed on the source/drain lower contact 233, and the source/drain contact 232 and the source/drain lower contact 233 may fill a trench defined by the silicide layer 512.

The second interlayer insulating film 700 is placed between the source/drain contact 230 and the source/drain lower contact 231 and between the source/drain contact 232 and the source/drain lower contact 233.

The contact via 330 may be placed on the source/drain contact 230. Further, the contact via 332 may be placed on the source/drain contact 232.

The first power supply rail 10 may be placed on the contact via 330, and the second power supply rail 20 may be placed on the contact via 332.

The third interlayer insulating film 800 may be placed on the second interlayer insulating film 700, and a fourth interlayer insulating film 900 may be placed on the third interlayer insulating film 800.

Differences from FIG. 10 are described in reference to FIG. 11. In FIG. 11, unlike FIG. 10, the silicide layers 510 and 512 may be formed only between the source/drain regions 500 and 502. That is, the silicide layer 510 may not be formed on the outer walls of the source/drain contact 230 and the source/drain lower contact 231 in the first direction y. Further, the silicide layer 512 may not be formed on the outer walls of the source/drain contact 232 and the source/drain lower contact 233 in the first direction y.

Figure 12:
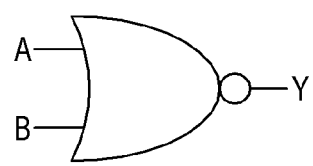
FIG. 12 is a diagram showing a NOR logic circuit.

FIG. 12 is a diagram showing a NOR logic circuit.

Referring to FIG. 12, a NOR logic circuit 2 may receive the first input A and the second input B to perform a NOR logical operation. The NOR logic circuit 2 may perform the NOR logical operation on the basis of the first input A and the second input B to generate an output Y.

The output Y generated by the NOR logic circuit 2 has "1" when both the first input A and the second input B are "0", and the output Y has "0" in the remaining cases.

Figure 13:
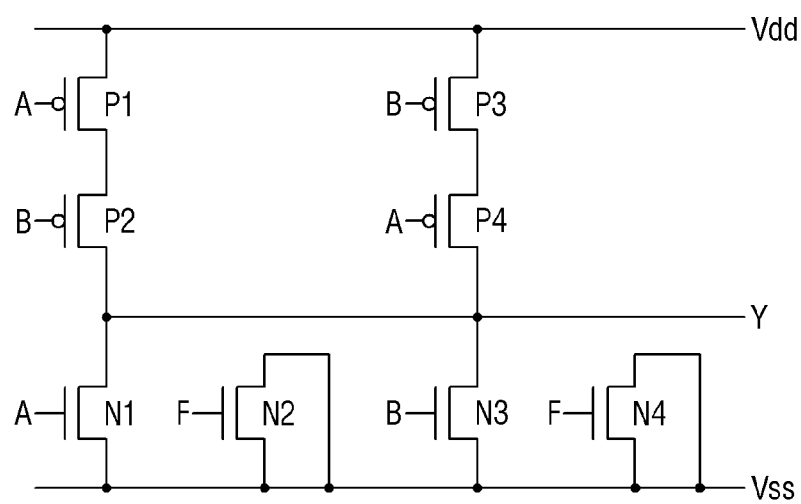
FIG. 13 is an exemplary circuit diagram showing the NOR logic circuit according to some embodiments.

The NOR logic circuit 2 is described in reference to a circuit diagram illustrated in FIG. 13

FIG. 13 is an exemplary circuit diagram showing the NOR logic circuit 2 according to some embodiments.

Referring to FIG. 13, the NOR logic circuit 2 according to some embodiments has transistors P1, P4 and N1 gated by the first input A, transistors P2, P3 and N3 gated by the second input B, and floating transistors N2 and N4.

The transistors P1, P2, P3 and P4 are PMOS transistors. Further, the transistors N1, N2, N3 and N4 are NMOS transistors.

The sources of the transistors N1 and N3 are connected to the ground voltage Vss, and the drains of the transistors N1 and N3 are connected to the output Y.

The transistors P1 and P2 are connected in series with each other. More specifically, the drain of the transistor P2 is connected to the output Y, the gate receives the second input B, and the source is connected to the drain of the transistor P1. Further, the source of the transistor P1 is connected to the power supply voltage Vdd, the gate receives the first input A, and the drain is connected to the source of the transistor N2.

The transistors P3 and P4 are connected in series with each other. More specifically, the drain of the transistor P4 is connected to the output Y, the gate receives the first input A, and the source is connected to the drain of the transistor P3. Further, the source of the transistor P3 is connected to the power supply voltage Vdd, the gate receives the second input B, and the drain is connected to the source of the transistor P4.

In some embodiments, both the sources and drains of the transistors N2 and N4 may be connected to the ground voltage Vss.

Therefore, since both the sources and drains of the floating transistors N2 and N4 are connected to the ground voltage Vss, the stability of the floating transistors N2 and N4 is improved. More specifically, both the sources and drains of the floating transistors N2 and N4 may be connected to the ground voltage Vss to reduce the output capacitance as seen from the output terminal Y. Alternatively or additionally, the sources of the floating transistors N2 and N4 may be connected to one power supply rail (e.g., the ground voltage Vss), and the drains of the floating transistors N2 and N4 may be connected to another power supply rail (e.g., the power supply voltage Vdd, an external power supply voltage Vdd_ext).

Figure 14:
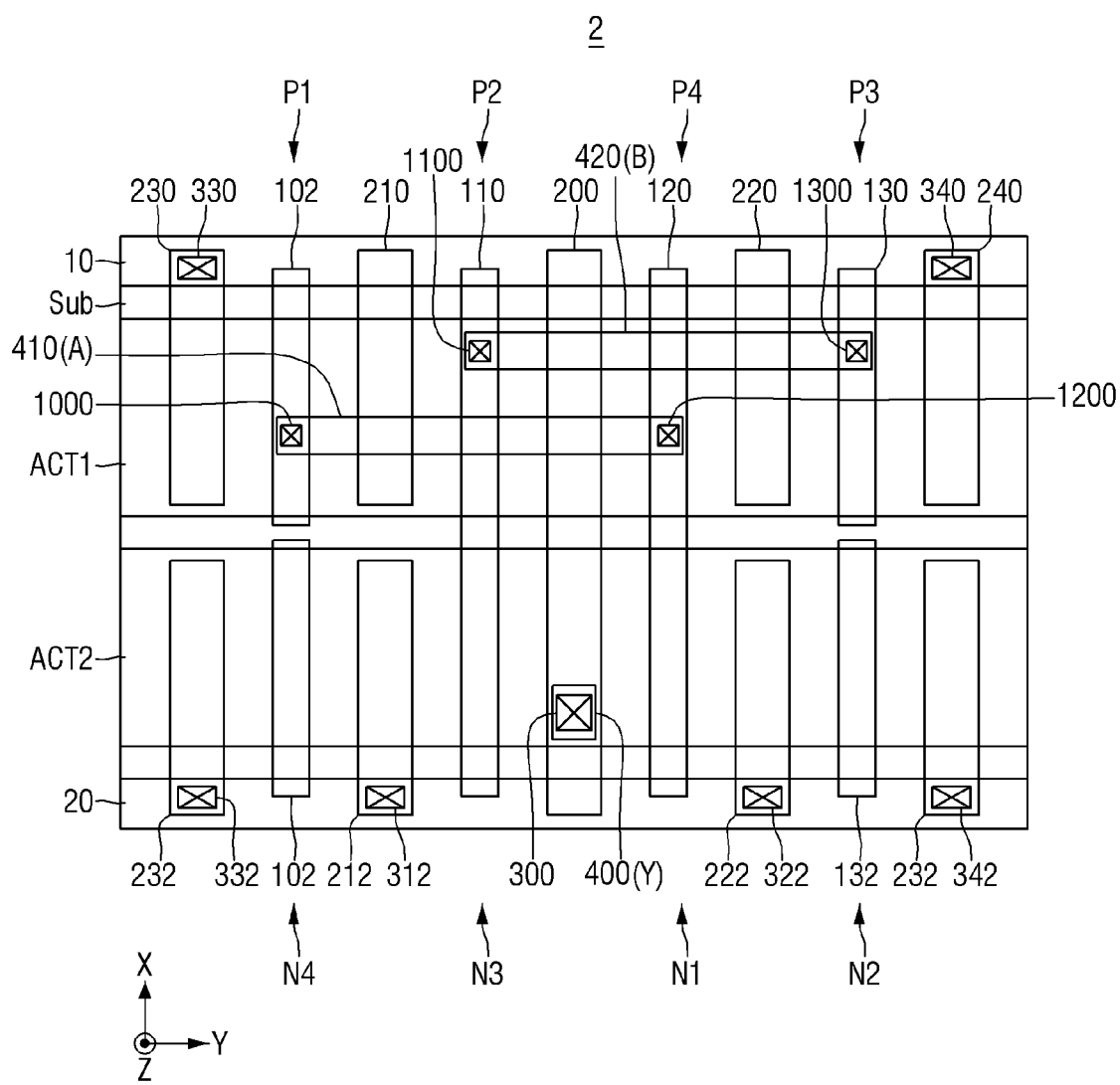
FIG. 14 is an exemplary circuit diagram showing the NOR logic circuit according to some embodiments.

A structure in which both the sources and drains of the floating transistors N2 and N4 are connected to the ground voltage Vss is described in reference to a layout diagram illustrated in FIG. 14.

FIG. 14 is an exemplary circuit diagram showing the NOR logic circuit 2 according to some embodiments.

Referring to FIG. 14, the PMOS transistors P1, P2, P3 and P4 may be formed on the first active region ACT1 extending in the first direction y. Further, the NMOS transistors N1, N2, N3 and N4 may be formed on the second active region ACT2 which extends in the first direction y and is placed apart from the first active region ACT1 in the second direction x.

For reference, although not shown, a first active pin protruding from the first active region ACT1 in the third direction z may be formed on the first active region ACT1. Further, a second active pin protruding from the second active region ACT2 in the third direction z may be formed on the second active region ACT2. The first active pin and the second active pin may be formed to be spaced apart from each other in the second direction x. Further, the first active pin and the second active pin may each extend in the first direction y.

The first active region ACT1 may be a region in which a p-type transistor is formed. The first active region ACT1 may include, for example, a well region doped with n-type impurities. The second active region ACT2 may be a region in which an n-type transistor is formed. The second active region ACT2 may include, for example, a well region doped with p-type impurities. The first active region ACT1 and the second active region ACT2 may be placed apart from each other along the second direction x.

The first power supply rail 10 may be placed in the upper part in the second direction x from the first active region ACT1. Further, the second power supply rail 20 may be placed in the lower part in the second direction x from the second active region ACT2. The first power supply rail 10 may be, for example, a power supply rail to which the power supply voltage Vdd is supplied. Further, the second power supply rail 20 may be, for example, a ground rail to which the ground voltage Vss is supplied.

The NOR logic circuit 2 according to some embodiments may include a plurality of gate structures 100, 102, 110, 120, 130, and 132 and source/drain contacts 200, 210, 212, 220, 222, 230, 232, 240, and 242 which extend in the second direction x and are spaced apart from each other in the first direction y.

For example, the source/drain contacts 210, 220, 230 and 240 extending in the other second direction x may be placed apart from each other in the first direction y, centering on the first source/drain contact 200 extending in the second direction x on the first active region ACT1.

Further, for example, a plurality of gate structures 100, 110, 120 and 130 may extend in the second direction x and be placed apart from each other in the first direction y.

Each of the source/drain contacts 212, 222, 232, and 242 may be electrically connected to the second power supply rail 20 through the contact vias 312, 322, 332, and 342 and receive supply of the ground voltage Vss.

That is, the first gate structure 102 and the source/drain contacts 212 and 232 may form a floating transistor N4 of FIG. 13. Further, the second gate structure 110 and the source/drain contacts 200 and 212 may form a transistor N3 of FIG. 13. Further, the third gate structure 120 and the source/drain contacts 200 and 222 may form a transistor N1 of FIG. 13. Further, the fourth gate structure 132 and the source/drain contacts 222 and 242 may form a floating transistor N2 of FIG. 13.

That is, both the sources and drains of the transistors N2 and N4 may be connected to the ground voltage Vss.

Therefore, since both the sources and drains of the floating transistors N2 and N4 are connected to the ground voltage Vss, the stability of the floating transistors N2 and N4 is improved. More specifically, both the sources and drains of the floating transistors N2 and N4 may be connected to the ground voltage Vss to reduce the output capacitance as seen from the output terminal Y.

For example, the source/drain contacts 210, 220, 230 and 240 extending in the other second direction x may be spaced apart from each other in the first direction y, centering on the source/drain contact 200 extending in the second direction x on the second active region ACT2.

Further, for example, a plurality of gate structures 100, 110, 120 and 130 may extend in the second direction x and be placed apart from each other in the first direction y.

Each of the source/drain contacts 230 and 240 may be electrically connected to the first power supply rail 10 through the contact vias 330 and 340 and receive supply of the power supply voltage Vdd.

That is, the fifth gate structure 100 and the source/drain contacts 210 and 230 may form the transistor N1 of FIG. 13. Further, the second gate structure 110 and the source/drain contacts 210 and 200 may form the transistor P2 of FIG. 13. Further, the third gate structure 120 and the source/drain contacts 200 and 220 may form the transistor P4 of FIG. 13. Further, the sixth gate structure 130 and the source/drain contacts 220 and 240 may form the transistor P3 of FIG. 13.

Each of the third gate structure 120 and the fifth gate structure 100 may be electrically connected to the first input contact via 1200 and the second input contact via 1000 to receive the first input A. More specifically, the first input contact via 1200 and the second input contact via 1000 are electrically connected to the metal line 410 that receives the first input A, the first input contact via 1200 transfers the first input A to the third gate structure 120, and the second input contact via 1000 may transfer the first input A to the fifth gate structure 100.

Each of the second gate structure 110 and the sixth gate structure 130 may be electrically connected to the third input contact via 1100 and the fourth input contact via 1300 to receive the second input B. More specifically, the third input contact via 1100 and the fourth input contact via 1300 are electrically connected to the metal line 420 that receives the second input B, the third input contact via 1100 transfers the second input B to the second gate structure 110, and the fourth input contact via 1300 may transfer the second input B to the sixth gate structure 130.

The NOR logic circuit 2 according to some embodiments may output the output Y of the NOR logical operation performed on the first input A and the second input B to the outside through the source/drain contact 200. More specifically, the source/drain contact 200 is electrically connected to the output contact via 300 and may transfer the output Y to the outside through the metal line 400 electrically connected to the output contact via 300.

The above-mentioned descriptions made in reference to FIGS. 4 to 11 may be applied to the structure for each layer and the cross-sectional structures along the third direction z of the NOR logic circuit 2 according to some embodiments, and, as such, in the interest of brevity, the description thereof is not provided.

Figure 15:
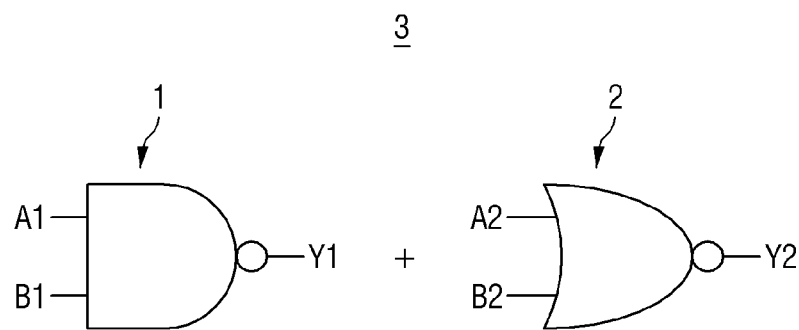
FIG. 15 is a diagram showing a NAND logic circuit and a NOR logic circuit together.

FIG. 15 is a diagram showing a NAND logic circuit 1 and a NOR logic circuit 2 together.

Referring to FIG. 15, it is possible to provide an integrated circuit 3 in which the NAND logic circuit 1 according to some embodiments and the NOR logic circuit 2 according to some embodiments are formed together.

For example, the NAND logic circuit 1 that receives a first NAND input A1 and a second NAND input B1 to generate a NAND output Y1, and the NOR logic circuit 2 that receives a first NOR input A1 and a second NOR input B2 to generate a NOR output Y2 may be formed adjacently.

In some embodiments, through a structure in which drain and source terminals of the floating transistors (e.g., P2 and P4 of FIGS. 2 and N2 and N4 of FIG. 13) of the NAND logic circuit 1 according to some embodiments and the NOR logic circuit 2 according to some embodiments are connected to each of the power supply voltage Vdd and the ground voltage Vss, the area can be reduced, when the NAND logic circuit 1 and the NOR logic circuit 2 are combined. The structure which may reduce the area when the NAND logic circuit 1 and the NOR logic circuit 2 are combined through the region shared by the NAND logic circuit 1 according to some embodiments and the NOR logic circuit 2 according to some embodiments are described in reference to FIGS. 16 to 22.

Figure 16:
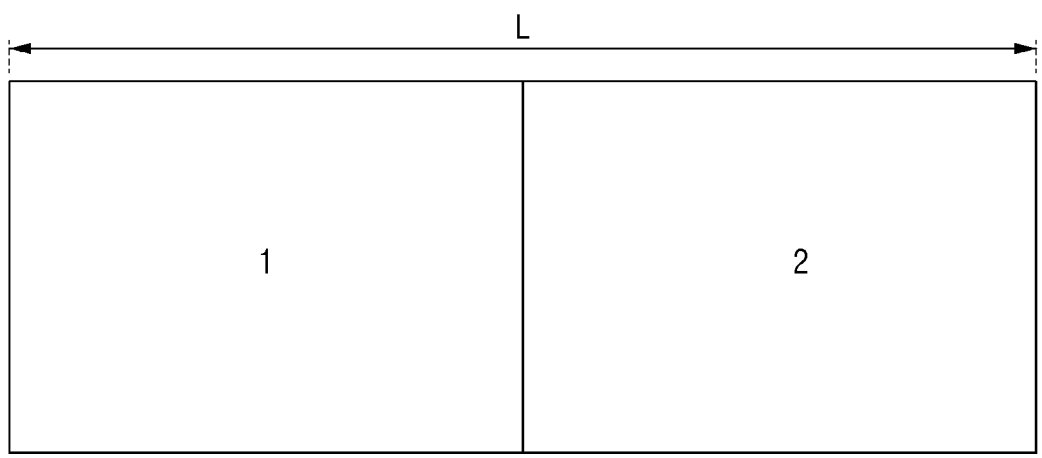
FIG. 16 is a simplified diagram showing both the NAND logic circuit and the NOR logic circuit.
Figure 16:
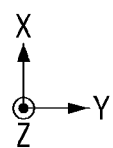

FIG. 16 is a simplified diagram showing both the NAND logic circuit 1 and the NOR logic circuit 2.

Hereinafter, for convenience of explanation, in the drawing showing the NAND logic circuit 1 according to some embodiments and the NOR logic circuit 2 according to some embodiments together, each of them are described by blocks.

Referring to FIG. 16, if the NAND logic circuit 1 and the NOR logic circuit 2 are simply combined (e.g., 301) without a region in which the NAND logic circuit 1 and the NOR logic circuit 2 are shared with each other, they may occupy an area having a horizontal length L in the first direction y.

Therefore, by setting a region shared between the NAND logic circuit 1, according to some embodiments, and the NOR logic circuit 2, according to some embodiments, an integrated circuit having the area smaller than the horizontal length L may be designed.

The integrated circuit is described in reference to FIGS. 17 to 22.

Figure 17:
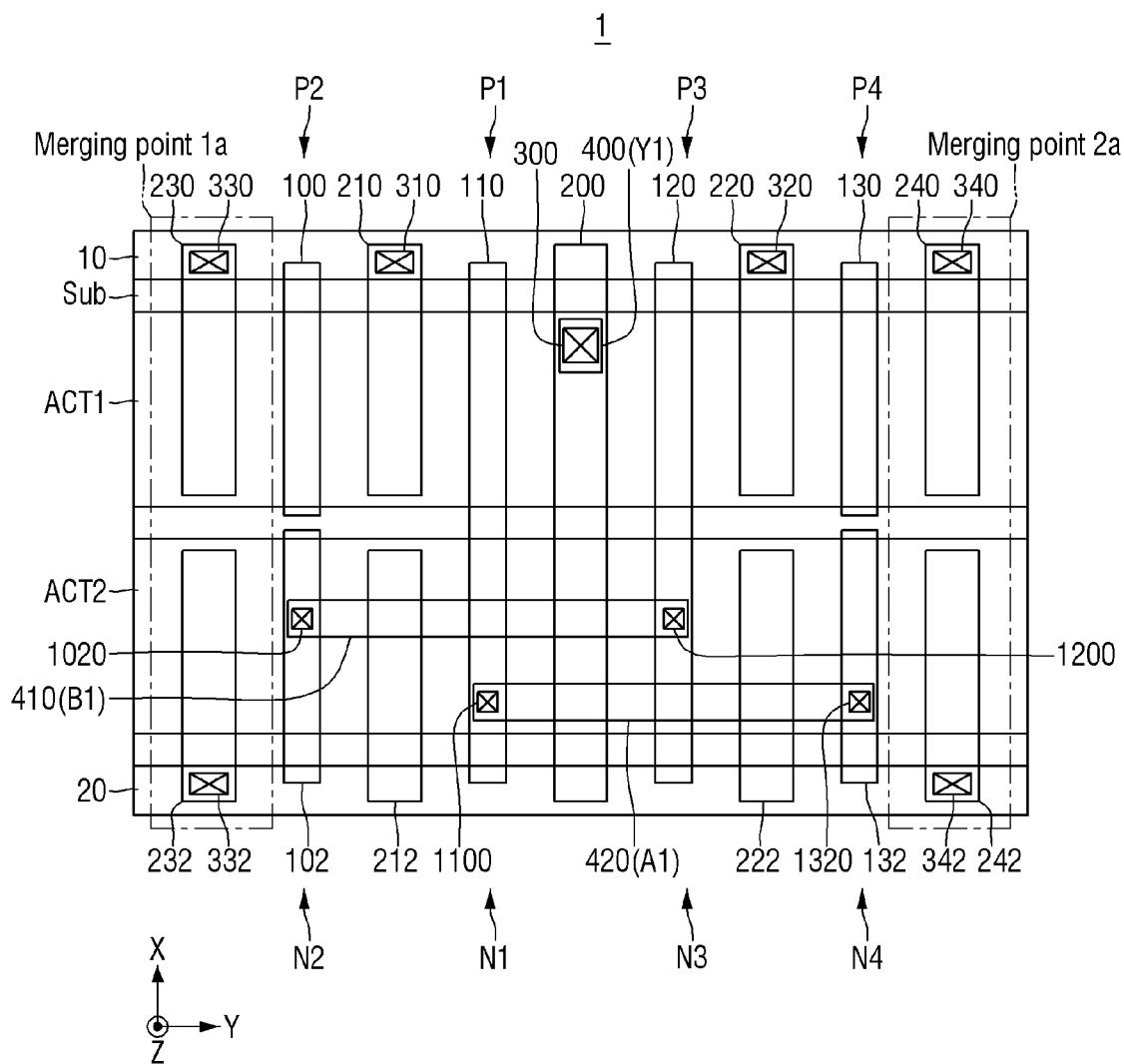
FIG. 17 is an exemplary layout diagram for explaining a merged region of the NAND logic circuit according to some embodiments when the NAND logic circuit and the NOR logic circuit are merged.
Figure 18:
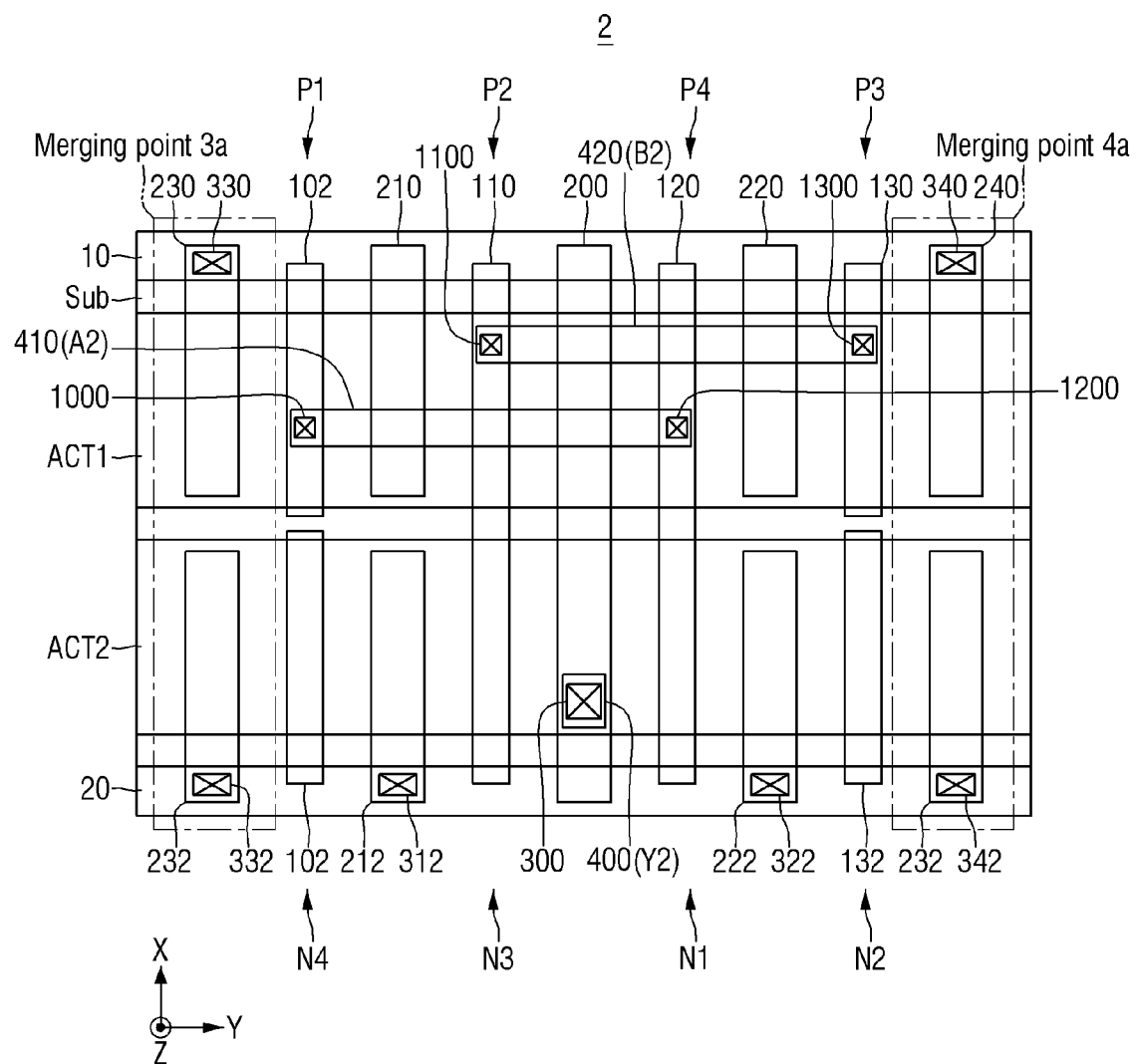
FIG. 18 is an exemplary layout diagram for explaining the merged region of the NOR logic circuit according to some embodiments when the NAND logic circuit and the NOR logic circuit are merged.

FIG. 17 is an exemplary layout diagram for explaining a merged region of the NAND logic circuit 1 according to some embodiments when the NAND logic circuit 1 and the NOR logic circuit 2 are merged. FIG. 18 is an exemplary layout diagram for explaining the merged region of the NOR logic circuit 2 according to some embodiments when the NAND logic circuit 1 and the NOR logic circuit 2 are merged.

Figure 19:
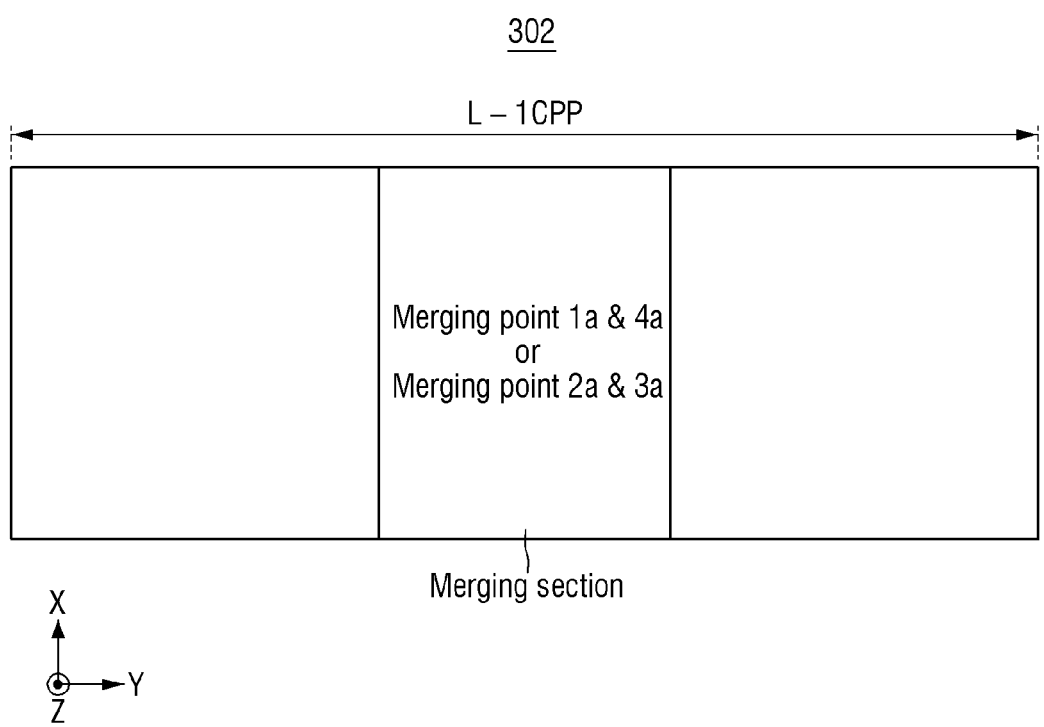
FIG. 19 is a simplified diagram showing both the NAND logic circuit and the NOR logic circuit.

For reference, since the layout diagram of the NAND logic circuit 1 of FIG. 17 is similar to the layout diagram of the NAND logic circuit 1 of FIG. 3, and the layout diagram of the NOR logic circuit 2 of FIG. 18 is similar to the layout diagram of the NOR logic circuit 2 of FIG. 14, a repeated specific description is not provided. FIG. 19 is a simplified diagram showing both the NAND logic circuit 1 and the NOR logic circuit 2.

Referring to FIGS. 17 to 19, for example, when the NAND logic circuit 1 according to some embodiments and the NOR logic circuit 2 according to some embodiments are combined, the logic circuits may be combined such that a merging point 2a of the NAND logic circuit 1 and a merging point 3a of the NOR logic circuit 2 are shared with each other.

That is, the transistor P4 of the NAND logic circuit 1 may share the source/drain contact 230 of the transistor P1 of the NOR logic circuit 2. As such, the transistor P1 of the NOR logic circuit 2 may share a source/drain contact 240 of the transistor P4 of the NAND logic circuit 1. Further, the transistor N4 of the NAND logic circuit 1 may share the source/drain contact 232 of the transistor N2 of the NOR logic circuit 2. That is, the transistor N2 of the NOR logic circuit 2 may share the source/drain contact 242 of the transistor N4 of the NAND logic circuit 1.

As another example, when the NAND logic circuit 1 according to some embodiments and the NOR logic circuit 2 according to some embodiments are combined, the logic circuits may be combined such that the merging point 1a of the NAND logic circuit 1 and a merging point 4a of the NOR logic circuit 2 are shared with each other.

That is, the transistor P2 of the NAND logic circuit 1 may share the source/drain contact 240 of the transistor P3 of the NOR logic circuit 2. As such, the transistor P3 of the NOR logic circuit 2 may share the source/drain contact 230 of the transistor P2 of the NAND logic circuit 1. Further, the transistor N4 of the NAND logic circuit 1 may share the source/drain contact 242 of the transistor N4 of the NOR logic circuit 2. That is, the transistor N4 of the NOR logic circuit 2 may share the source/drain contact 232 of the transistor N4 of the NAND logic circuit 1.

As described above, when the logic circuits 1 and 2 are combined (e.g., 302), using the merging points 1a, 2a, 3a, and/or 4a of the logic circuits 1 and 2, the logic circuits may decrease by 1 CPP in the first direction y as in FIG. 19.

That is, by combining (e.g., 302) the logic circuits 1 and 2, using the merging points 1a, 2a, 3a, and/or 4a of the logic circuits 1 and 2, the logic circuits have a length in which the length in the first direction y decreases by 1 CPP from the horizontal length L.

Figure 20:
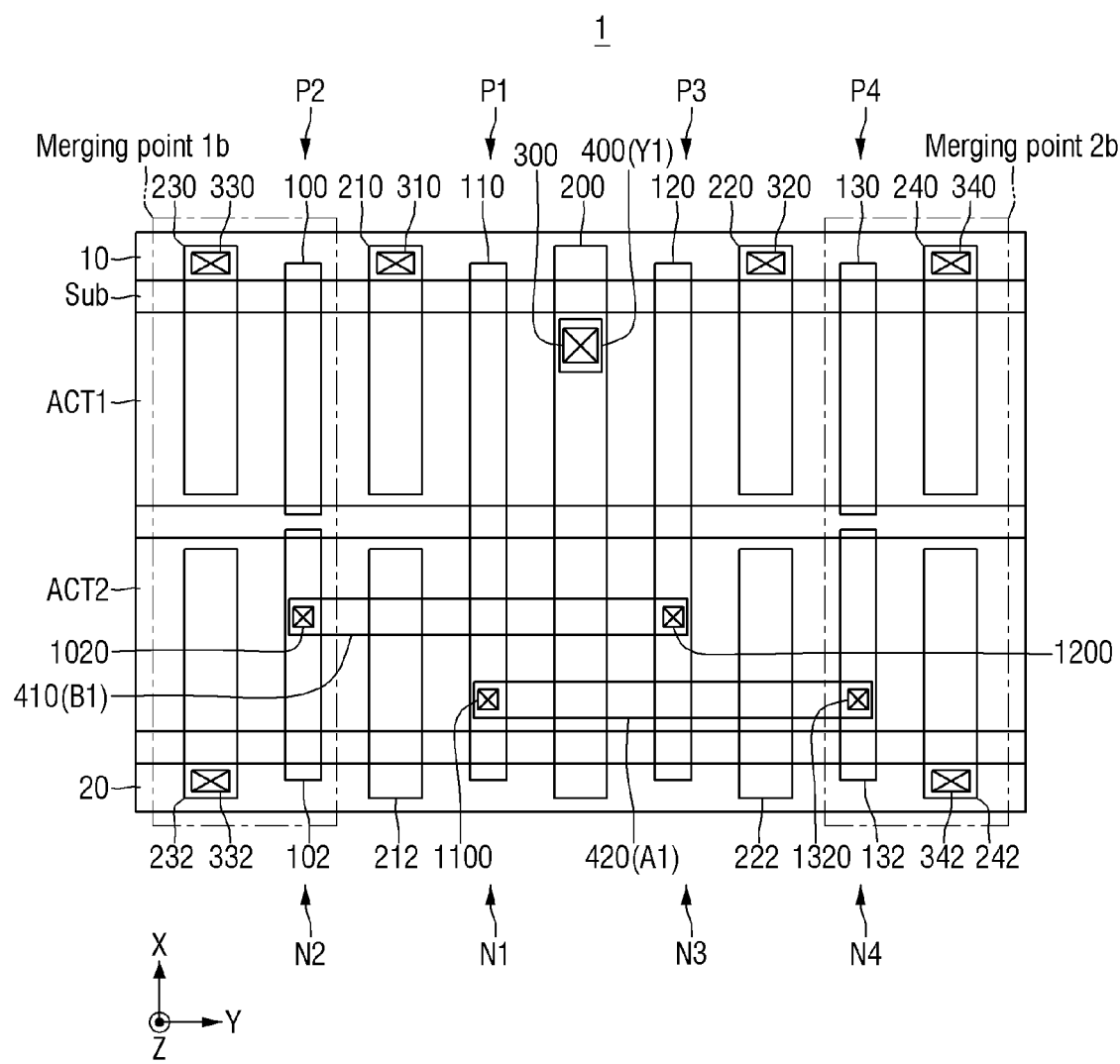
FIG. 20 is an exemplary layout diagram for explaining a merged region of the NAND logic circuit according to some embodiments, when the NAND logic circuit and the NOR logic circuit are merged.
Figure 21:
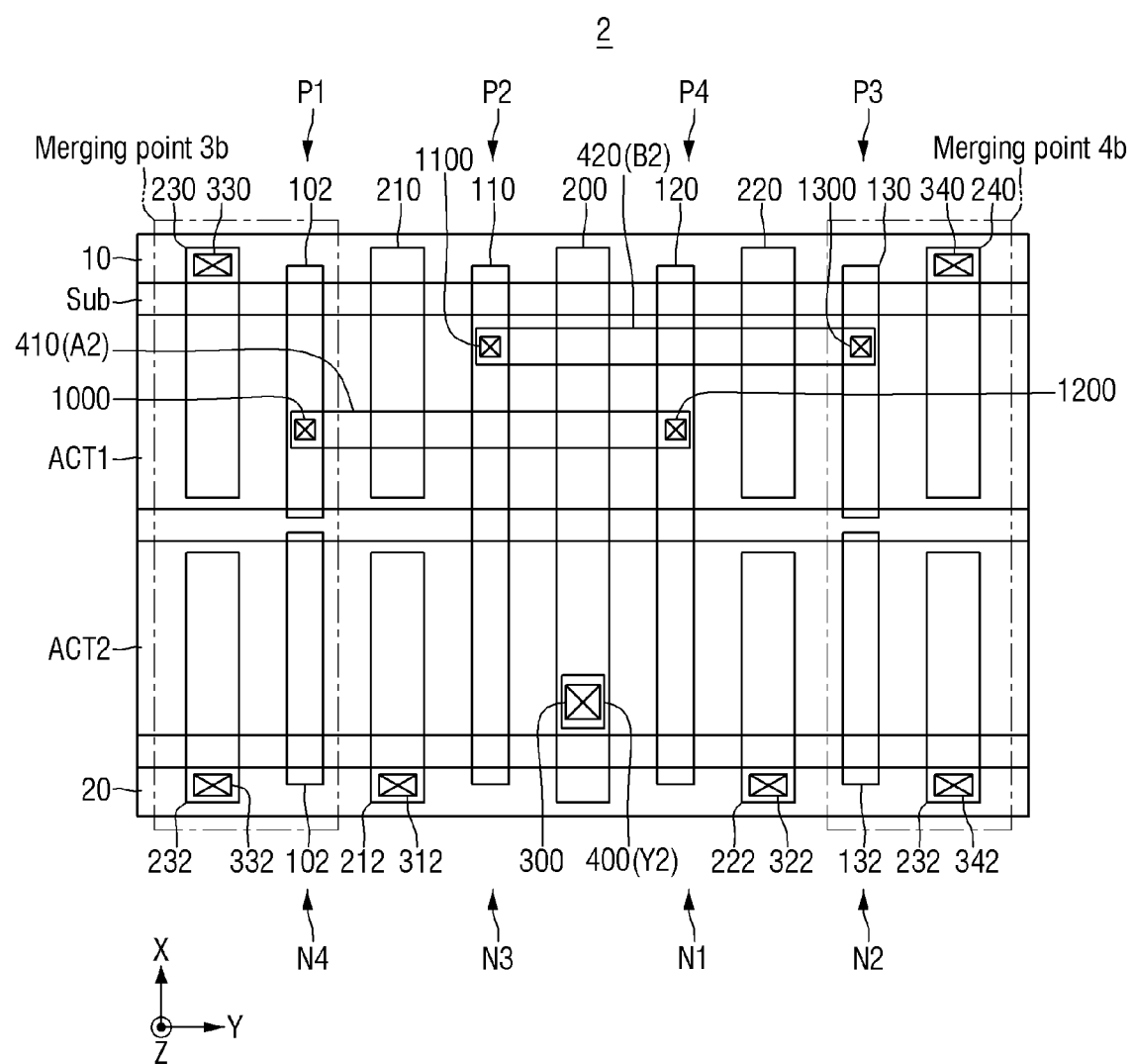
FIG. 21 is an exemplary layout diagram for explaining the merged region of the NOR logic circuit according to some embodiments, when the NAND logic circuit and the NOR logic circuit are merged.
Figure 22:
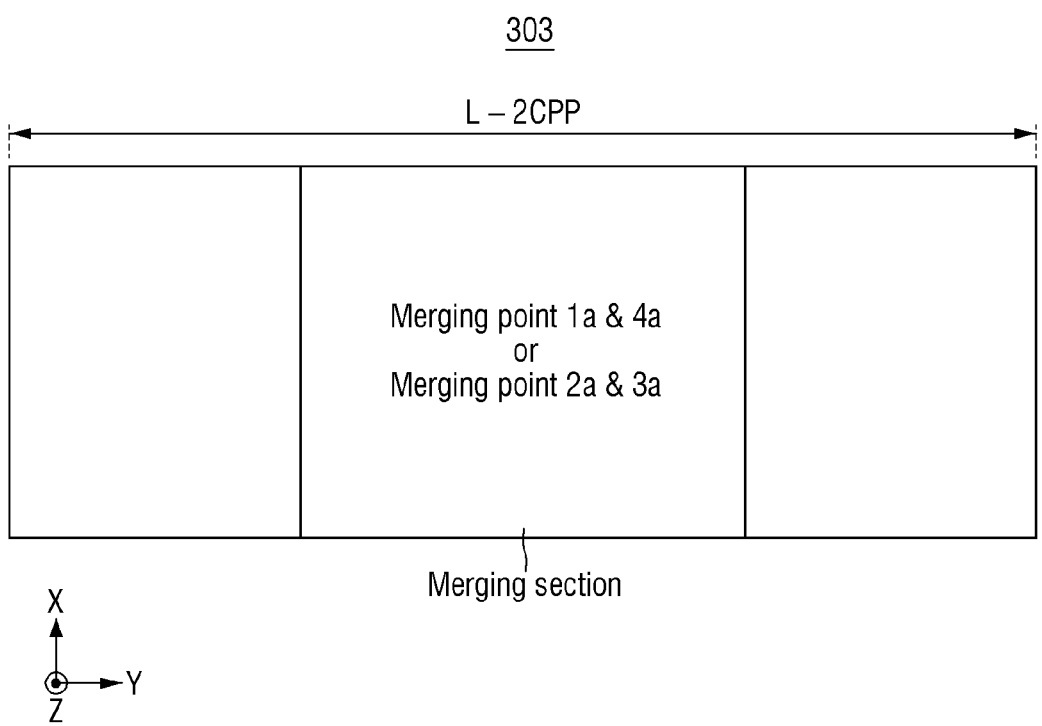
FIG. 22 is a simplified diagram showing both the NAND logic circuit and the NOR logic circuit.

FIG. 20 is an exemplary layout diagram for explaining a merged region of the NAND logic circuit 1 according to some embodiments, when the NAND logic circuit 1 and the NOR logic circuit 2 are merged. FIG. 21 is an exemplary layout diagram for explaining the merged region of the NOR logic circuit 2 according to some embodiments, when the NAND logic circuit 1 and the NOR logic circuit 2 are merged. FIG. 22 is a simplified diagram showing both the NAND logic circuit 1 and the NOR logic circuit 2.

For reference, since the layout diagram of the NAND logic circuit 1 of FIG. 20 is similar to the layout diagram of the NAND logic circuit 1 of FIG. 3, and the layout diagram of the NOR logic circuit 2 of FIG. 21 is similar to the layout diagram of the NOR logic circuit 2 of FIG. 14, repeated specific description is not provided.

Referring to FIGS. 20 to 22, for example, when the NAND logic circuit 1 according to some embodiments and the NOR logic circuit 2 according to some embodiments are combined, the logic circuits may be combined such that the merging point 2b of the NAND logic circuit 1 and the merging point 3b of the NOR logic circuit 2 are shared with each other.

That is, the transistor P4 of the NAND logic circuit 1 may share the source/drain contact 230 and the gate structure 100 of the transistor P1 of the NOR logic circuit 2. As such, the transistor P1 of the NOR logic circuit 2 may share the source/drain contact 240 and the gate structure 130 of the transistor P4 of the NAND logic circuit 1. Further, the transistor N4 of the NAND logic circuit 1 may share the source/drain contact 232 and the gate structure 102 of the transistor N2 of the NOR logic circuit 2. That is, the transistor N2 of the NOR logic circuit 2 may share the source/drain contact 242 and the gate structure 132 of the transistor N4 of the NAND logic circuit 1.

As still another example, when the NAND logic circuit 1 according to some embodiments and the NOR logic circuit 2 according to some embodiments are combined, the logic circuits may be combined such that the merging point 1b of the NAND logic circuit 1 and the merging point 4b of the NOR logic circuit 2 are shared with each other.

That is, the transistor P2 of the NAND logic circuit 1 may share the source/drain contact 240 and the gate structure 130 of the transistor P3 of the NOR logic circuit 2. As such, the transistor P3 of the NOR logic circuit 2 may share the source/drain contact 230 and the gate structure 100 of the transistor P2 of the NAND logic circuit 1. Further, the transistor N4 of the NAND logic circuit 1 may share the source/drain contact 242 and the gate structure 132 of the transistor N4 of the NOR logic circuit 2. That is, the transistor N4 of the NOR logic circuit 2 may share the source/drain contact 232 and the gate structure 102 of the transistor N4 of the NAND logic circuit 1.

As described above, when the logic circuits 1 and 2 are combined (e.g., 303), using the merging points 1b, 2b, 3b, and/or 4b of the logic circuits 1 and 2, the logic circuits may decrease by 2CPP in the first direction y as in FIG. 22.

That is, by combining the logic circuits 1 and 2 using the merging points 1b, 2b, 3b, and/or 4b of the logic circuits 1 and 2, the logic circuits have a length in which the length in the first direction y decreases by 2 CPP from the horizontal length L.

The NAND logic circuit 1 and the NOR logic circuit 2, according to some embodiments, described above may utilize floating gates (e.g., P2 and P4 of FIG. 2, and N2 and N4 of FIG. 13) as power gating circuits. The structure and operation in which the NAND logic circuit 1 and the NOR logic circuit 2 according to some embodiments utilize the floating gate (e.g., P2 and P4 of FIG. 2, and N2 and N4 of FIG. 13) as a power gating circuit is described in reference to FIGS. 23 to 26.

Hereinafter, repeated explanation of the contents described above is not provided, and the differences are mainly described.

Figure 23:
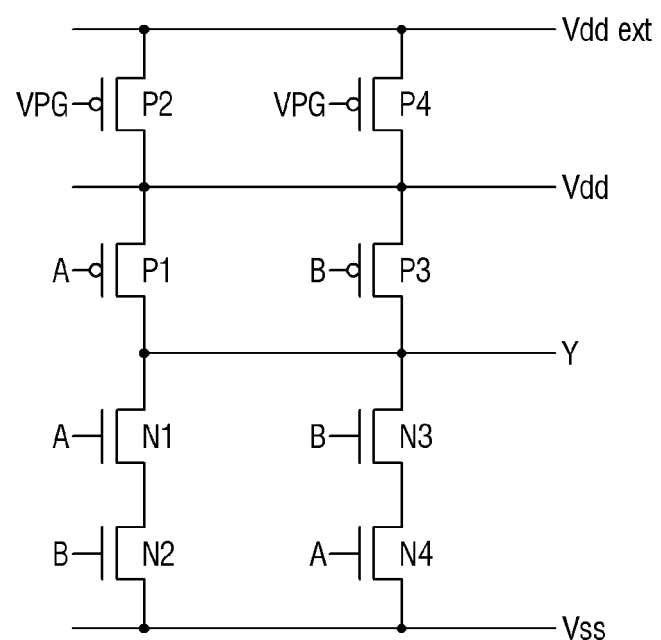
FIG. 23 is an exemplary circuit diagram showing a NAND logic circuit according to some embodiments including the power gating circuit.

FIG. 23 is an exemplary circuit diagram showing a NAND logic circuit according to some embodiments including the power gating circuit.

Referring to FIG. 23, in a NAND logic circuit 4 according to some embodiments, unlike the NAND logic circuit 1 of FIG. 2, transistors P2 and P4 may serve as the power gating circuit.

The power gating circuit is a circuit for reducing a leakage current that may occur in the transistors P1 and P3, and the transistors P2 and P4 that serve as the power gating circuit may serve to block the flow of current, when a leakage current occurs in each of the transistors P1 and P3.

The transistors P2 and P4 may be gated through separate power gating voltage VPG. Further, the sources of the transistors P2 and P4 may be connected to the external power supply voltage Vdd_ext. The drain of the transistor P2 may be connected to the source of the transistor P1. Further, the drain of the transistor P4 may be connected to the source of the transistor P3.

That is, by forming the power gating circuit that requires another configuration, using the transistors P2 and P4 of the NAND logic circuit 4 according to some embodiments, it is possible to reduce an area of the integrated circuit including the NAND logic circuit 4 including the power gating circuit.

Figure 24:
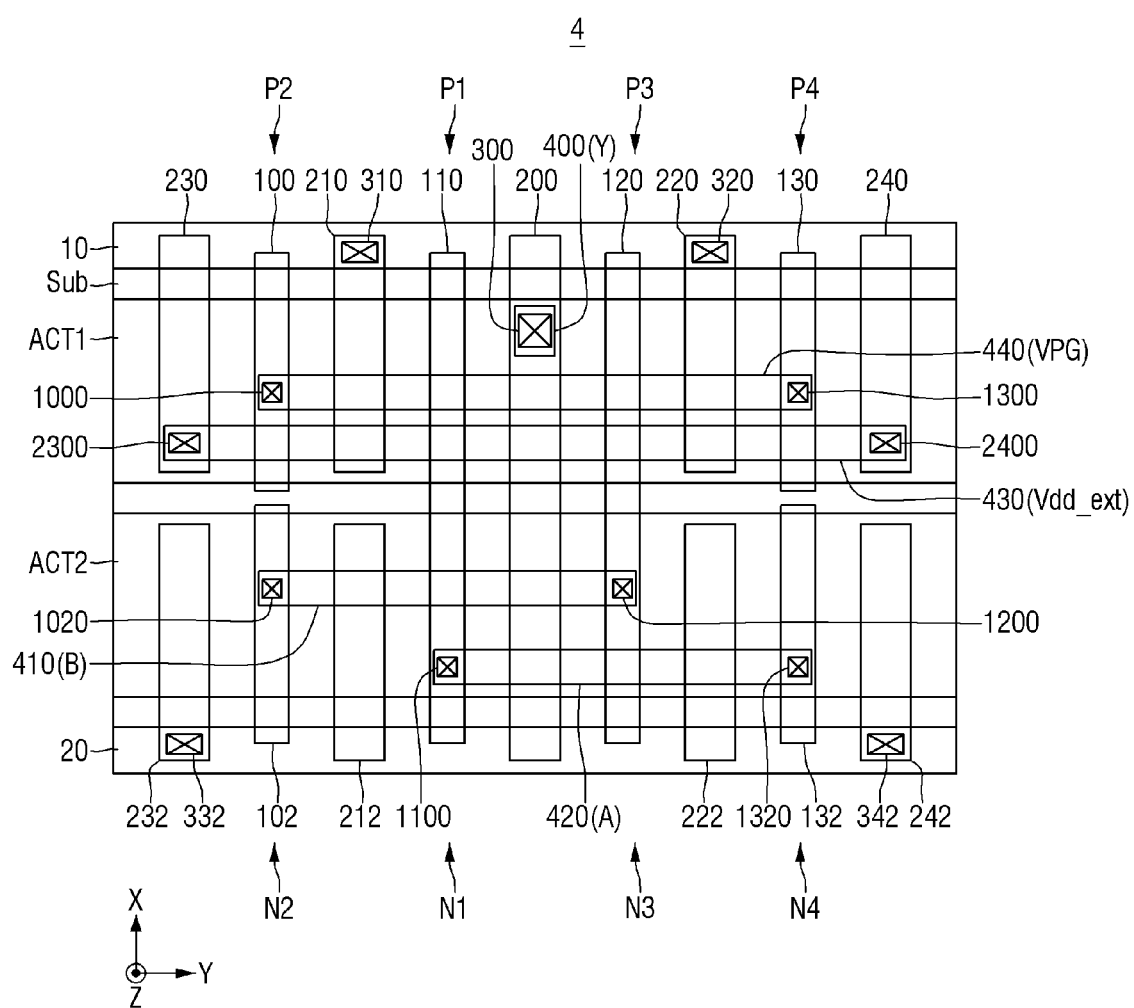
FIG. 24 is an exemplary layout diagram showing a NAND logic circuit according to some embodiments including the power gating circuit.

A structure in which the floating transistors P2 and P4 of FIG. 2 are formed by the power gating circuit is described in reference to a layout diagram illustrated in FIG. 24.

FIG. 24 is an exemplary layout diagram showing a NAND logic circuit 4 according to some embodiments including the power gating circuit.

Referring to FIG. 24, a source/drain contact 230 forming the transistor P2 may be electrically connected to a contact via 2300. The contact via 2300 is electrically connected to a metal line 430 and may be provided with an external power supply voltage Vdd_ext. That is, the external power supply voltage Vdd_ext may be supplied from the metal line 430 to the source/drain contact 230 forming the transistor P2. Further, the gate structure 100 forming the transistor P2 may be electrically connected to an external input contact via 1000. The external input contact via 1000 is electrically connected to a metal line 440 and may be provided with the power gating voltage VPG. That is, the power gating voltage VPG may be supplied from the metal line 440 to the gate structure 100 forming the transistor P2.

Further, the source/drain contact 240 forming the transistor P4 may be electrically connected to a contact via 2400. The contact via 2400 is electrically connected to the metal line 430 and may be provided with the external power supply voltage Vdd_ext. That is, the external power supply voltage Vdd_ext may be supplied from the metal line 430 to the source/drain contact 240 forming the transistor P4. Further, the gate structure 130 forming the transistor P4 may be electrically connected to an external input contact via 1300. The external input contact via 1300 is electrically connected to a metal line 440 and may be provided with the power gating voltage VPG. That is, the power gating voltage VPG may be supplied from the metal line 440 to the gate structure 130 forming the transistor P4.

That is, the direct circuit including the NAND logic circuit 4 according to some embodiments may form the power gating circuit, using the transistors P2 and P4 of the NAND logic circuit 4, without the need for a space for a separate power gating circuit. Therefore, it is possible to reduce the area of the direct circuit including the NAND logic circuit 4 according to some embodiments including the power gating circuit.

Figure 25:
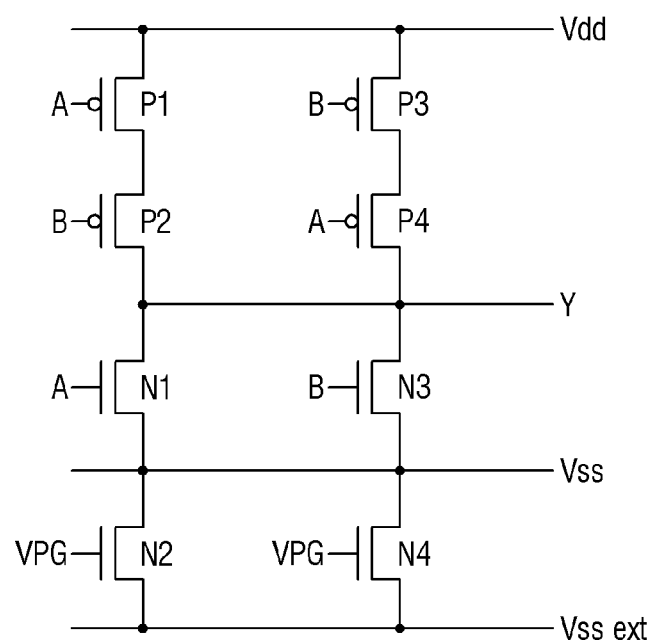
FIG. 25 is an exemplary circuit diagram showing a NOR logic circuit according to some embodiments including the power gating circuit.

FIG. 25 is an exemplary circuit diagram showing a NOR logic circuit according to some embodiments including the power gating circuit.

Referring to FIG. 25, in a NOR logic circuit 5 according to some embodiments, unlike the NOR logic circuit 2 of FIG. 13, transistors N2 and N4 may serve as a power gating circuit.

The power gating circuit is a circuit for reducing a leakage current that may occur in the transistors N1 and N3, and the transistors N2 and N4 that serve as the power gating circuit may serve to block the flow of current, when a leakage current occurs in each of the transistors N1 and N3.

The transistors N2 and N4 may be gated through separate power gating voltages VPG. Further, the sources of the transistors N2 and N4 may be connected to the external ground voltage Vss_ext. The drain of the transistor N2 may be connected to the source of the transistor N1. Further, the drain of the transistor N4 may be connected to the source of the transistor N3.

That is, it is possible to reduce an area of the integrated circuit including the NOR logic circuit 5 including the power gating circuit, by forming the power gating circuit that requires another configuration, using the transistors N2 and N4 of the NOR logic circuit 5 according to some embodiments.

Figure 26:
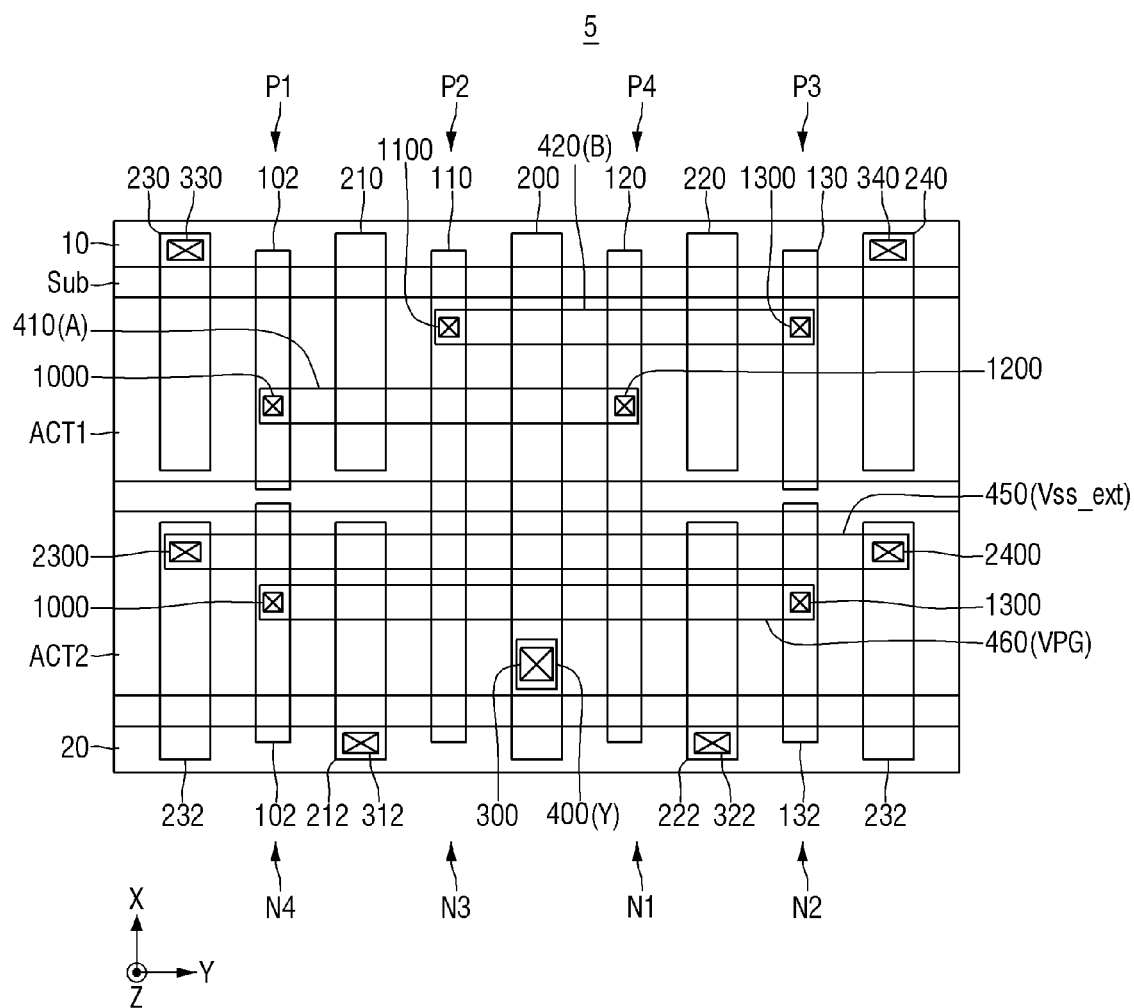
FIG. 26 is an exemplary layout diagram showing the NOR logic circuit according to some embodiments including the power gating circuit.

The structure in which the floating transistors P2 and P4 of FIG. 13 are formed by the power gating circuit is described in reference to a layout diagram illustrated in FIG. 26.

FIG. 26 is an exemplary layout diagram showing the NOR logic circuit 5 according to some embodiments including the power gating circuit.

Referring to FIG. 26, a source/drain contacts 232 forming the transistor N4 may be electrically connected to a contact via 2320. The contact via 2320 is electrically connected to a metal line 450 and may be provided with an external ground voltage Vss_ext. That is, the external ground voltage Vss_ext may be supplied from the metal line 450 to the source/drain contact 232 forming the transistor N4. Further, the gate structure 102 forming the transistor N4 may be electrically connected to an external input contact via 1020. The external input contact via 1020 is electrically connected to the metal line 460 and may be provided with the power gating voltage VPG. That is, the power gating voltage VPG may be supplied from the metal line 460 to the gate structure 102 forming the transistor N4.

Further, a source/drain contact 242 forming the transistor N2 may be electrically connected to a contact via 2420. The contact via 2420 is electrically connected to the metal line 450, and may be provided with the external ground voltage Vss_ext. That is, the external ground voltage Vss_ext may be supplied from the metal line 450 to the source/drain contact 242 forming the transistor N2. Further, the gate structure 132 forming the transistor N2 may be electrically connected to an external input contact via 1320. The external input contact via 1320 is electrically connected to a metal line 460 and may be provided with the power gating voltage VPG. That is, the power gating voltage VPG may be supplied from the metal line 460 to the gate structure 132 forming the transistor N2.

That is, the direct circuit including the NOR logic circuit 5 according to some embodiments may form the power gating circuit, using the transistors N2 and N4 of the NOR logic circuit 5, without the need for a space for a separate power gating circuit. Therefore, it is possible to reduce the area of the direct circuit including the NOR logic circuit 5 according to some embodiments including the power gating circuit.

Although embodiments of the present disclosure have been described above with reference to the accompanying drawings, it may be understood by those of ordinary skill in the art that the present disclosure is not limited thereto and may be implemented in many different forms without departing from the technical idea or essential features thereof. Therefore, it should be understood that the embodiments set forth herein are merely examples in all respects and not restrictive.

What is claimed is:

1. An integrated circuit comprising:
   a first transistor, which is gated by a first input, and has one end connected to a first power supply rail and another end connected to an output;
   a second transistor, which is gated by a second input, and has one end connected to the first power supply rail and another end connected to the output;
   a floating third transistor that has one end connected to the first power supply rail and another end connected to a third power supply rail;
   a floating fourth transistor that has one end connected to the first power supply rail and another end connected to the third power supply rail;
   a fifth transistor, which is gated by the first input, and has one end connected to a second power supply rail;
   a sixth transistor, which is gated by the second input, and has one end connected to the second power supply rail;
   a seventh transistor, which is gated by the second input, and has one end connected in series with the fifth transistor and another end connected to the output; and
   an eighth transistor, which is gated by the first input, and has one end connected in series with the sixth transistor and another end connected to the output.

2. The integrated circuit of claim 1, wherein a power supply voltage is supplied to the first power supply rail and the third power supply rail, and
   the first transistor, the second transistor, the floating third transistor, and the floating fourth transistor are P-channel metal-oxide-semiconductor (PMOS) transistors.

3. The integrated circuit of claim 2, wherein a ground voltage is supplied to the second power supply rail, and
   the fifth transistor, the sixth transistor, the seventh transistor, and the eighth transistor are N-channel metal-oxide-semiconductor (NMOS) transistors.

4. The integrated circuit of claim 1, wherein a ground voltage is supplied to the first power supply rail and the third power supply rail, and
   the first transistor, the second transistor, the floating third transistor, and the floating fourth transistor are N-channel metal-oxide-semiconductor (NMOS) transistors.

5. The integrated circuit of claim 1, wherein a power supply voltage is supplied to the second power supply rail, and
   the fifth transistor, the sixth transistor, the seventh transistor, and the eighth transistor are P-channel metal-oxide-semiconductor (PMOS) transistors.

6. The integrated circuit of claim 1, wherein a power supply voltage is supplied to the first power supply rail,
   a ground voltage is supplied to the second power supply rail, and
   an external power supply voltage is supplied to the third power supply rail.

7. The integrated circuit of claim 6, wherein the first transistor, the second transistor, the floating third transistor, and the floating fourth transistor are P-channel metal-oxide-semiconductor (PMOS) transistors.

8. The integrated circuit of claim 1, wherein the fifth transistor, the sixth transistor, the seventh transistor, and the eighth transistor are N-channel metal-oxide-semiconductor (NMOS) transistors.

9. The integrated circuit of claim 1, wherein a power supply voltage is supplied to the first power supply rail,
   a ground voltage is supplied to the second power supply rail, and
   an external ground voltage is supplied to the third power supply rail.

10. The integrated circuit of claim 9, wherein the first transistor, the second transistor, the floating third transistor, and the floating fourth transistor are P-channel metal-oxide-semiconductor (PMOS) transistors.

11. The integrated circuit of claim 10, wherein the fifth transistor, the sixth transistor, the seventh transistor, and the eighth transistor are N-channel metal-oxide-semiconductor (NMOS) transistors.

12. An integrated circuit comprising:
    a first active region that extends in a first direction;

a second active region that extends in the first direction and that is spaced apart from the first active region in a second direction intersecting the first direction;
a first source/drain contact that extends in the second direction, on the first active region and the second active region;
an output contact via that is electrically connected to the first source/drain contact, and is configured to generate an output voltage;
a first gate structure that is spaced apart from the first source/drain contact in the first direction, that extends in the second direction, and that is placed on the first active region and the second active region;
a second gate structure that is spaced apart from the first source/drain contact in the first direction, that extends in the second direction, and that is placed on the first active region and the second active region;
a second source/drain contact and a third source/drain contact that are spaced apart from the first gate structure in the first direction, that extend in the second direction, and that are spaced apart from each other in the second direction;
a fourth source/drain contact and a fifth source/drain contact that are spaced apart from the second gate structure in the first direction, that extend in the second direction, and that are spaced apart from each other in the second direction;
a third gate structure and a fourth gate structure that are spaced apart from the second source/drain contact and the third source/drain contact in the first direction, that extend in the second direction, and that are spaced apart from each other in the second direction;
a fifth gate structure and a sixth gate structure that are spaced apart from the fourth source/drain contact and the fifth source/drain contact in the first direction, that extend in the second direction, and that are spaced apart from each other in the second direction;
a sixth source/drain contact and a seventh source/drain contact that are spaced apart from the third gate structure and the fourth gate structure in the first direction, that extend in the second direction, and that are spaced apart from each other in the second direction; and
an eighth source/drain contact and a ninth source/drain contact that are spaced apart from the fifth gate structure and the sixth gate structure in the first direction, that extend in the second direction, and that are spaced apart from each other in the second direction,
wherein the fourth gate structure is electrically connected to a first input contact via and configured to receive a first input through the first input contact via,
the second gate structure is electrically connected to a second input contact via and configured to receive the first input through the second input contact via,
the first gate structure is electrically connected to a third input contact via and configured to receive a second input through the third input contact via,
the sixth gate structure is electrically connected to a fourth input contact via and configured to receive the second input through the fourth input contact via,
the second source/drain contact and the fourth source/drain contact are electrically connected to a first power supply rail,
the seventh source/drain contact and the ninth source/drain contact are electrically connected to a second power supply rail, and the sixth source/drain contact and the eighth source/drain contact are electrically connected to a third power supply rail.

13. The integrated circuit of claim 12, wherein the first active region is doped with n-type impurities,
the second active region is doped with p-type impurities,
a power supply voltage is supplied to the first power supply rail and the third power supply rail, and
a ground voltage is supplied to the second power supply rail.

14. The integrated circuit of claim 13, wherein the first input contact via, the third input contact via, the second input contact via, and the fourth input contact via are sequentially placed on the second active region along the first direction.

15. The integrated circuit of claim 12, wherein the first active region is doped with p-type impurities,
the second active region is doped with n-type impurities,
a ground voltage is supplied to the first power supply rail and the third power supply rail, and
a power supply voltage is supplied to the second power supply rail.

16. The integrated circuit of claim 15, wherein the first input contact via, the third input contact via, the second input contact via, and the fourth input contact via are sequentially placed on the first active region along the first direction.

17. The integrated circuit of claim 12, wherein the first active region is doped with n-type impurities,
the second active region is doped with p-type impurities,
a power supply voltage is supplied to the first power supply rail,
a ground voltage is supplied to the second power supply rail, and
an external power supply voltage is supplied to the third power supply rail.

18. The integrated circuit of claim 12, wherein the first active region is doped with p-type impurities,
the second active region is doped with n-type impurities,
a ground voltage is supplied to the first power supply rail,
a power supply voltage is supplied to the second power supply rail, and
an external power supply voltage is supplied to the third power supply rail.

19. An integrated circuit, including:
a logic circuit configured to receive a first input and a second input, and to perform a logical operation to generate an output,
wherein the logic circuit comprises:
a first transistor, which is gated by the first input, and has one end connected to a first power supply rail and another end connected to the output;
a second transistor, which is gated by the second input, and has one end connected to the first power supply rail and another end connected to the output;
a floating third transistor that has one end connected to the first power supply rail and another end connected to a third power supply rail;
a floating fourth transistor that has one end connected to the first power supply rail and another end connected to the third power supply rail;
a fifth transistor, which is gated by the first input, and has one end connected to a second power supply rail;
a sixth transistor, which is gated by the second input, and has one end connected to the second power supply rail;

a seventh transistor, which is gated by the second input, and has one end connected in series with the fifth transistor, and another end connected to the output; and an eighth transistor, which is gated by the first input, and has one end connected in series with the sixth transistor and another end connected to the output.

20. The integrated circuit of claim 19, wherein the logic circuit includes at least one of a NAND logic circuit, a NOR logic circuit, and a power gating circuit.

* * * * *